(12) United States Patent
Hara

(10) Patent No.: US 12,489,047 B2
(45) Date of Patent: Dec. 2, 2025

(54) SEMICONDUCTOR DEVICE

(71) Applicant: ROHM CO., LTD., Kyoto (JP)

(72) Inventor: Hideo Hara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 487 days.

(21) Appl. No.: 17/928,128

(22) PCT Filed: May 25, 2021

(86) PCT No.: PCT/JP2021/019732
§ 371 (c)(1),
(2) Date: Nov. 28, 2022

(87) PCT Pub. No.: WO2021/251126
PCT Pub. Date: Dec. 16, 2021

(65) Prior Publication Data
US 2023/0207440 A1 Jun. 29, 2023

(30) Foreign Application Priority Data
Jun. 8, 2020 (JP) .................. 2020-099389

(51) Int. Cl.
| | | |
|---|---|---|
| *H01L 23/498* | (2006.01) | |
| *H01L 21/48* | (2006.01) | |
| *H01L 25/16* | (2023.01) | |
| *H01L 23/00* | (2006.01) | |
| *H01L 23/31* | (2006.01) | |

(52) U.S. Cl.
CPC .... *H01L 23/49838* (2013.01); *H01L 21/4853* (2013.01); *H01L 23/49861* (2013.01); *H01L 25/16* (2013.01); *H01L 23/3121* (2013.01); *H01L 24/06* (2013.01); *H01L 24/45* (2013.01); *H01L 24/48* (2013.01); *H01L 24/49* (2013.01);
(Continued)

(58) Field of Classification Search
CPC ...................... H01L 23/495; H01L 23/49541
See application file for complete search history.

(56) References Cited

U.S. PATENT DOCUMENTS

| 6,262,474 B1 | 7/2001 | Kobayashi et al. |
| 2020/0303319 A1* | 9/2020 | Khanolkar .............. H01L 21/56 |

(Continued)

FOREIGN PATENT DOCUMENTS

| DE | 10 2014 116 662 A1 | 5/2016 |
| JP | 2008-135735 A | 6/2008 |

(Continued)

OTHER PUBLICATIONS

International Search Report issued in PCT/JP2021/019732, Jul. 27, 2021 (2 pages).

(Continued)

*Primary Examiner* — Yu-Hsi D Sun
(74) *Attorney, Agent, or Firm* — HSML P.C.

(57) ABSTRACT

A semiconductor device includes a substrate, a conductive part formed on a front surface of the substrate, a semiconductor chip disposed on the front surface of the substrate, a control unit that controls the semiconductor chip, a sealing resin that covers the semiconductor chip, the control unit and the conductive part, and a first lead bonded to the conductive part and partially exposed from the sealing resin. The conductive part includes a first pad and a second pad disposed apart from each other. The first lead is bonded to the first pad and the second pad.

18 Claims, 18 Drawing Sheets

(52) U.S. Cl.
CPC ............... *H01L 2224/05553* (2013.01); *H01L 2224/05573* (2013.01); *H01L 2224/0603* (2013.01); *H01L 2224/06163* (2013.01); *H01L 2224/06181* (2013.01); *H01L 2224/45124* (2013.01); *H01L 2224/45139* (2013.01); *H01L 2224/45144* (2013.01); *H01L 2224/45147* (2013.01); *H01L 2224/48227* (2013.01); *H01L 2224/49505* (2013.01)

(56) References Cited

U.S. PATENT DOCUMENTS

| | | | |
|---|---|---|---|
| 2021/0125903 A1* | 4/2021 | Tani | ........................ H01L 24/73 |
| 2023/0121777 A1* | 4/2023 | Ishimatsu | ......... H01L 23/49575 |
| | | | 257/666 |

FOREIGN PATENT DOCUMENTS

| | | |
|---|---|---|
| JP | 2008-135753 A | 6/2008 |
| JP | 2014-123700 A | 7/2014 |
| JP | 2020-4893 A | 1/2020 |
| WO | 2019/244372 A1 | 12/2019 |

OTHER PUBLICATIONS

Office Action issued in corresponding Japanese Patent application No. 2022-530107, Feb. 25, 2025, and machine translation (6 pages).

Office Action issued in corresponding German Patent application No. 11 2021 001 976.7, Sep. 30, 2025, and machine translation (8 pages).

* cited by examiner (a)

(b)

SEMICONDUCTOR DEVICE

TECHNICAL FIELD

The present disclosure relates to a semiconductor device.

BACKGROUND ART

As one of various types of semiconductor devices, there exists a semiconductor device called an IPM (Intelligent Power Module). This type of semiconductor device has a semiconductor chip, a control chip that controls the semiconductor chip, and a sealing resin covering the semiconductor chip and the control chip (see Patent Document 1).

TECHNICAL REFERENCE

Patent Document

Patent Document 1: JP-A-2020-4893

SUMMARY OF THE INVENTION

Problems to be Solved by the Invention

The control chip receives multiple types of signals and also outputs multiple types of signals. As the number of such signals increases, the number of conduction paths connected to the control chip needs to be increased. However, such conduction paths are conventionally constituted by a plurality of metal leads, which may hinder higher integration of the semiconductor device.

In light of the above-noted circumstances, an object of the present disclosure is to provide a semiconductor device that allows higher integration than conventional ones.

Means for Solving the Problems

A semiconductor device provided according to a first aspect of the present disclosure includes: a substrate having a substrate front surface and a substrate back surface facing away from each other in a thickness direction; a conductive part made of an electrically conductive material and formed on the substrate front surface; a semiconductor chip disposed on the substrate front surface; a control unit that is disposed on the substrate front surface and controls the semiconductor chip; a sealing resin that covers the semiconductor chip, the control unit, the conductive part and at least a portion of the substrate; and a first lead bonded to the conductive part via the conductive bonding material and partially exposed from the sealing resin. The conductive part includes a first pad and a second pad disposed apart from each other. The first lead is bonded to the first pad and the second pad.

Advantages of the Invention

According to the above configuration, the conductive part is formed on the substrate front surface. Thus, the conduction paths to the electronic components disposed on the substrate front surface can be constituted by the conductive part. This makes it possible to provide thinner and denser conduction paths as compared with the case where such conduction paths are constituted by metal leads, for example. Moreover, the first lead is bonded to the first pad and the second pad via the conductive bonding material. With such an arrangement, the noise input to the first pad via a connecting conductor is released from the first lead to the outside. Thus, such noise is prevented from being input to another electronic component via the second pad and the connecting conductor connected to the second pad. Thus, as compared with a case where the first lead is connected to a single pad, the effects of noise are reduced.

Other features and advantages of the present disclosure will become clearer from the description given below with reference to the accompanying drawings.

MODE FOR CARRYING OUT THE INVENTION

Figure 1:
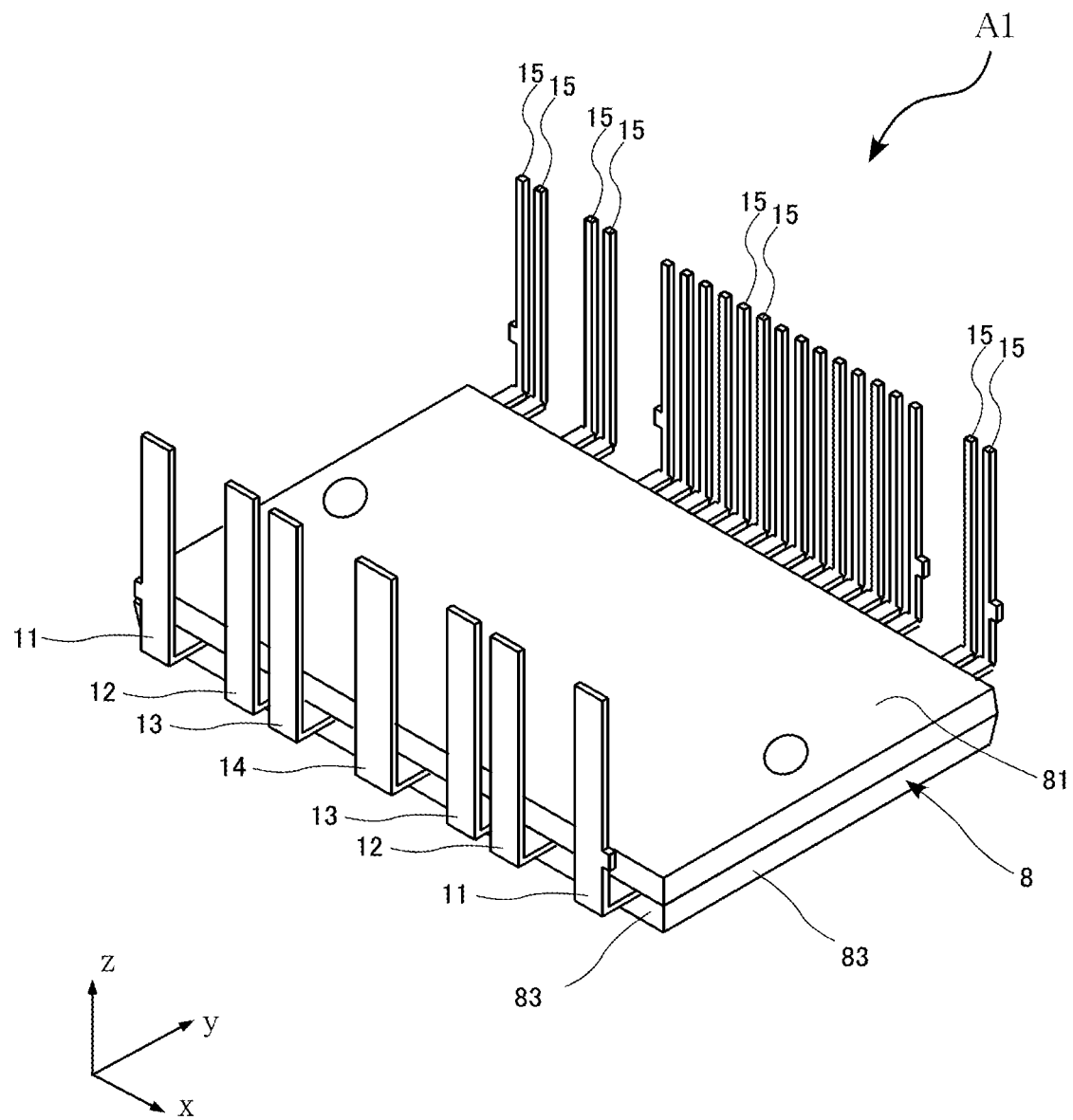
FIG. 1 is a perspective view showing a semiconductor device according to a first embodiment of the present disclosure.

Preferred embodiments of the present disclosure are described below with reference to the accompanying drawings.

In the present disclosure, the phrases "an object A is formed in an object B" and "an object A is formed on an object B" include, unless otherwise specified, "an object A is formed directly in/on an object B" and "an object A is formed in/on an object B with another object interposed between the object A and the object B". Similarly, the phrases "an object A is disposed in an object B" and "an object A is disposed on an object B" include, unless otherwise specified, "an object A is disposed directly in/on an object B" and "an object A is disposed in/on an object B with another object interposed between the object A and the object B". Similarly, the phrase "an object A is located on an object B" includes, unless otherwise specified, "an object A is located on an object B in contact with the object B" and "an object A is located an object B with another object interposed between the object A and the object B". Also, the phrase "an object A overlaps with an object B" includes, unless otherwise specified, "the object A overlaps with the entirety of the object B" and "the object A overlaps with a portion of the object B".

First Embodiment

FIGS. 1-10 show an example of a semiconductor device according to the present disclosure. The semiconductor device A1 according to the present embodiment has a plurality of leads 1, a substrate 2, a plurality of bonding parts 25, a conductive part 3, four semiconductor chips 4, four control units 5, a plurality of passive elements 6, a plurality of wires 71, a plurality of wires 72, and a sealing resin 8. In the present embodiment, the semiconductor device A1 is an IPM (Intelligent Power Module). The semiconductor device A1 is used for an air conditioner or a motor control device, for example.

Figure 2:
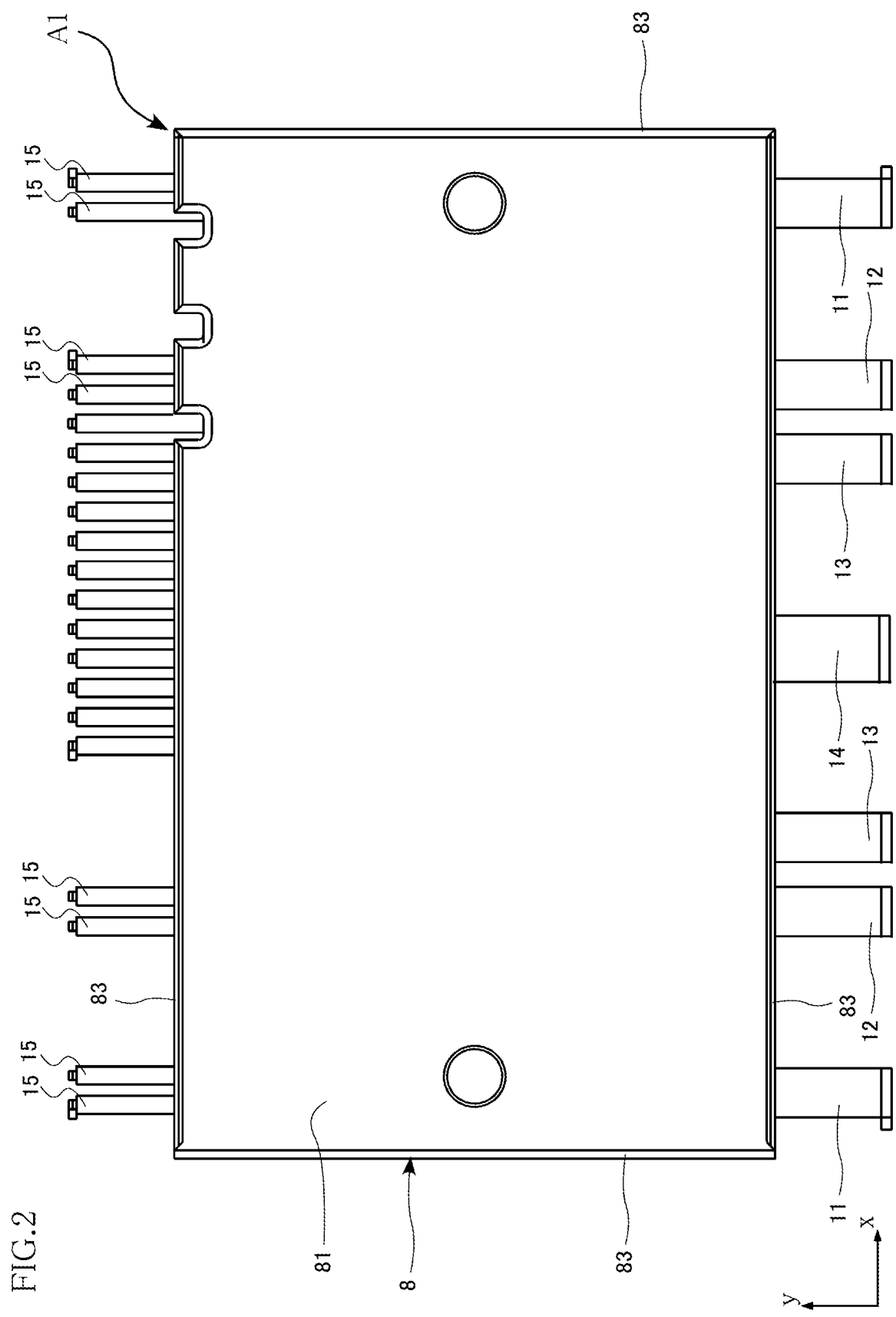
FIG. 2 is a plan view showing the semiconductor device of FIG. 1.
Figure 3:
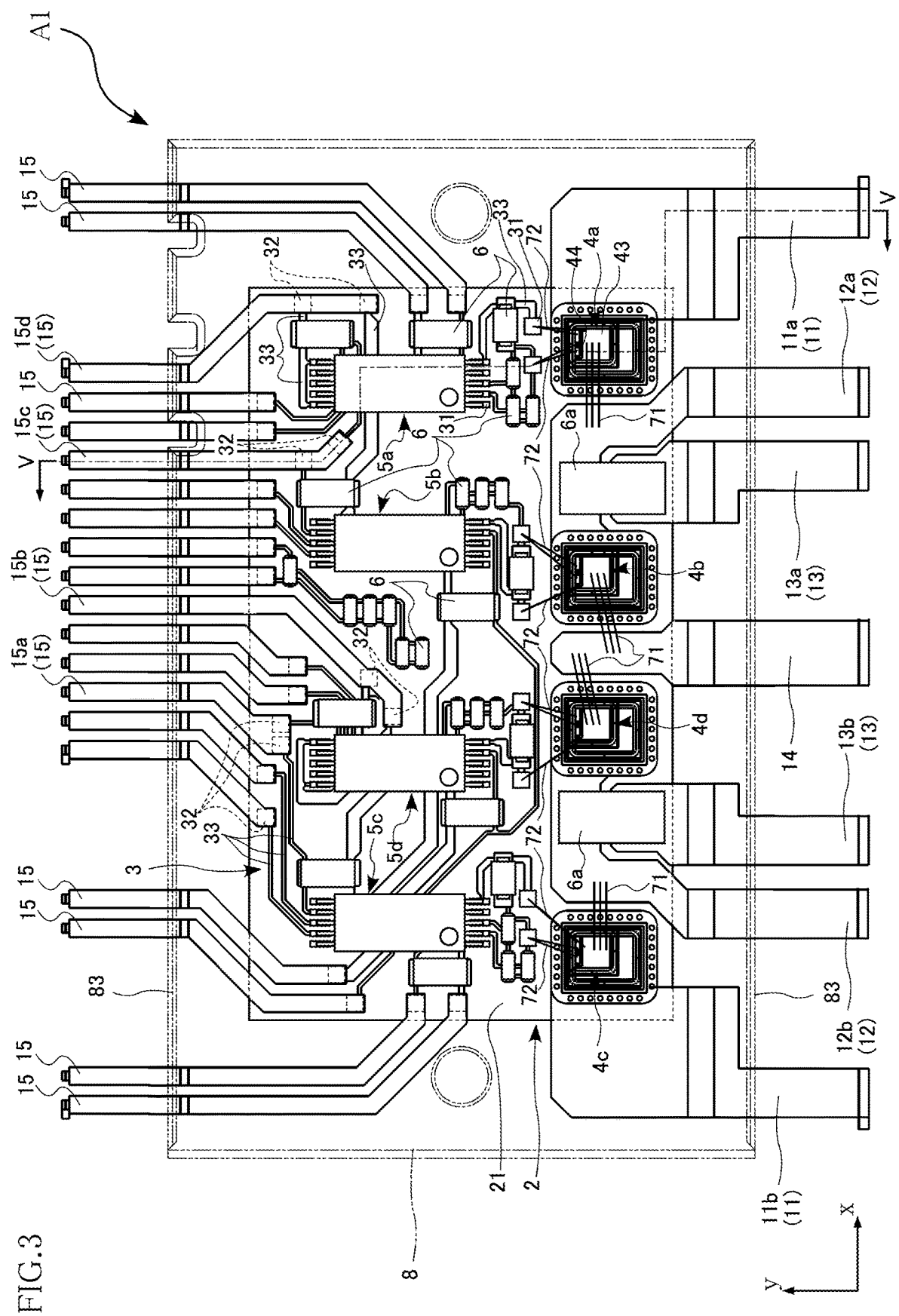
FIG. 3 is a plan view showing the semiconductor device of FIG. 1 seen through a sealing resin.
Figure 4:
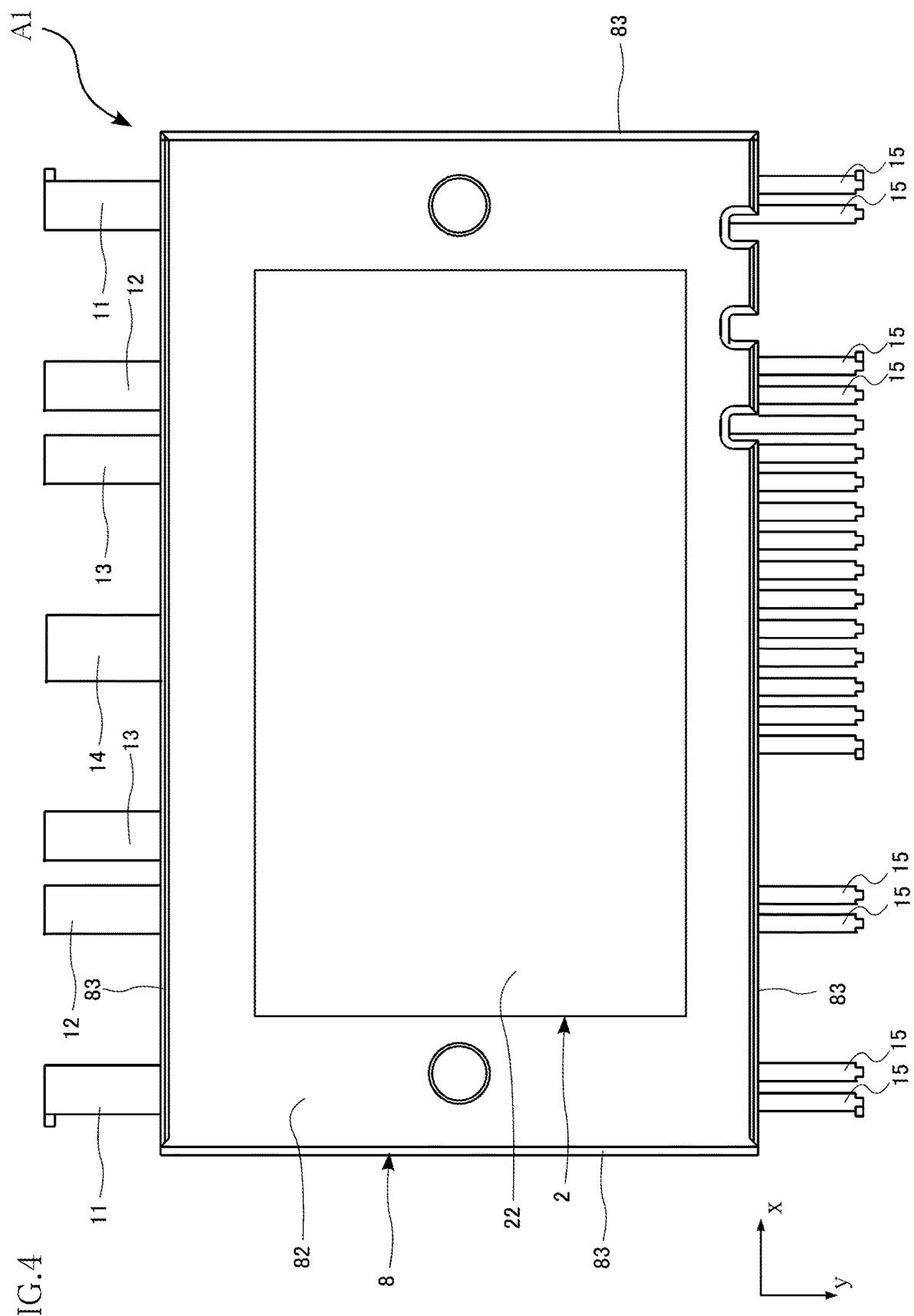
FIG. 4 is a bottom view showing the semiconductor device of FIG. 1.
Figure 5:
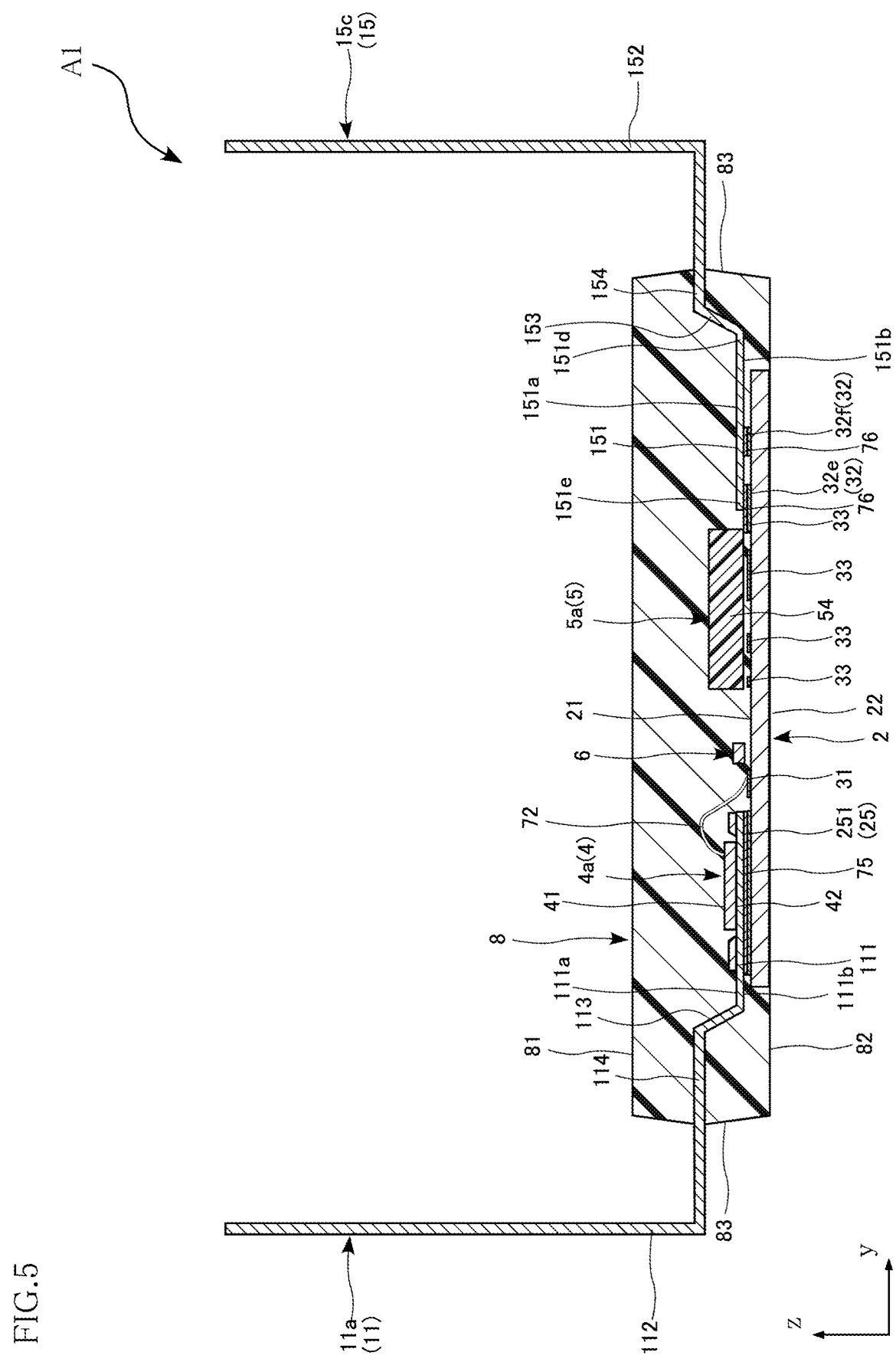
FIG. 5 is a sectional view taken along line V-V in FIG. 3.

FIG. 1 is a perspective view of the semiconductor device A1. FIG. 2 is a plan view of the semiconductor device A1. FIG. 3 is a plan view showing the semiconductor device A1 seen through the sealing resin 8. In FIG. 3, the outline of the sealing resin 8 is shown by an imaginary line (double-dotted line). FIG. 4 is a bottom view of the semiconductor device A1. FIG. 5 is a sectional view taken along line V-V in FIG. 3. FIGS. 6-9 each are an enlarged view showing a portion of FIG. 3. FIG. 10 is a plan view of the substrate 2.

For convenience of description, the thickness direction (plan-view direction) of the substrate 2 is referred to as z direction, and the direction (horizontal direction in FIGS. 2-4) that is along one side of the substrate 2 orthogonal to the z direction is referred to as x direction. The direction (vertical direction in FIGS. 2-4) that is orthogonal to both of the z direction and the x direction is referred to as y direction. The z direction is one example of the "thickness direction".

The substrate is in the form of a plate having a rectangular shape elongated in the x direction as viewed in the z direction. The thickness (dimension in the z direction) of the substrate 2 is about 0.1 to 1.0 mm, for example. The dimensions of the substrate 2 are not limited. The substrate 2 is made of an insulating material. The material for the substrate 2 is not limited. For example, as the material for the substrate 2, a material with a higher thermal conductivity than that of the material for the sealing resin 8 is preferred. Examples of the material for the substrate 2 include ceramics such as alumina ($Al_2O_3$), silicon nitride (SiN), aluminum nitride (AlN), and alumina combined with zirconia.

The substrate 2 has a substrate front surface 21 and a substrate back surface 22. The substrate front surface 21 and the substrate back surface 22 face away from each other in the z direction and are both flat surfaces orthogonal to the z direction. The substrate front surface 21 faces upward in FIG. 5. On the substrate front surface 21, the conductive part 3 and the bonding parts 25 are formed, and a plurality of leads 1 and a plurality of electronic components are mounted. The four semiconductor chips 4, the four control units 5 and the passive elements 6 are included in the electronic components. The substrate back surface 22 faces downward in FIG. 5. As shown in FIG. 4, the substrate back surface 22 is exposed from the sealing resin 8. The substrate front surface 21 and the substrate back surface 22 are both rectangular. The shape of the substrate 2 is not limited.

The conductive part 3 is formed on the substrate 2. In the present embodiment, the conductive part 3 is formed on the substrate front surface 21 of the substrate 2. The conductive part 3 is made of an electrically conductive material. The conductive material for the conductive part 3 is not limited. Examples of the conductive material for the conductive part 3 include materials containing silver (Ag), copper (Cu) or gold (Au), for example. The conductive part 3 containing silver is described below as an example. Note however that the conductive part 3 may contain copper instead of silver or may contain gold instead of silver or copper. Alternatively, the conductive part 3 may contain Ag—Pt or Ag—Pd. The method for forming the conductive part 3 is not limited. For example, the conductive part may be formed by baking a paste containing these metals. The thickness of the conductive part 3 is not limited and may be about 5 to 30 μm, for example.

The configuration of the conductive part 3 is not limited. In the present embodiment, as shown in FIG. 10 for example, the conductive part 3 includes a plurality of pads 31, a plurality of pads 32 and a plurality of connecting conductors 33. Each pad 31 is rectangular, for example, and one of the control units 5, passive elements 6 and wires 72 is conductively bonded to the pad. The shape of the pads 31 is not limited. The pads 31 are disposed apart from each other.

Each pad 32 is rectangular, for example, and a lead 15 (described later) is conductively bonded to the pad. The shape of the pads 32 is not limited. The pads 32 are disposed apart from each other. In the present embodiment, the pads 32 are formed at a first end in the y direction (upper end in FIG. 10) or at opposite ends in the x direction on the substrate front surface 21 of the substrate 2. As shown in FIGS. 6-9, the pads 32 include pads 32a, 32b, 32c, 32d, 32e, 32f, 32g, and 32h. The pad 32a and the pad 32b are bonded to the same lead 1 (lead 15a described later). The pad 32c and the pad 32d are bonded to the same lead 1 (lead 15b described later). The pad 32e and the pad 32f are bonded to the same lead 1 (lead 15c described later). The pad 32g and the pad 32h are bonded to the same lead 1 (lead 15d described later).

Each of the connecting conductors 33 is connected to a pad 31 and another pad 31, or to a pad 31 and a pad 32. In the present embodiment, as shown in FIGS. 6-9, some of the connecting conductors 33 overlap with a control unit 5 as viewed in the z direction. That is, these connecting conductors 33 are disposed between the substrate front surface 21 of the substrate 2 and a control unit 5. Also, some of the connecting conductors 33 overlap with a passive element 6 as viewed in the z direction. That is, these connecting conductors 33 are disposed between the substrate front surface 21 of the substrate 2 and a passive element 6.

As shown in FIG. 10, the bonding parts 25 are formed on the substrate 2. In the present embodiment, the bonding parts 25 are formed at locations offset toward a second end in the y direction (lower side in FIG. 10) on the substrate front surface 21 of the substrate 2. The material for the bonding parts 25 is not limited, and a material capable of bonding the substrate 2 and the leads 1 is used, for example. For example, the bonding parts 25 are made of an electrically conductive material. The conductive material for the bonding parts 25 is not limited. Examples of the conductive material for the bonding parts 25 include materials containing silver (Ag), copper (Cu) or gold (Au), for example. The bonding parts 25 containing silver are described below as an example. The bonding parts 25 in this example contain the same conductive material as that forming the conductive parts 3. Note that the bonding parts 25 may contain copper instead of silver or may contain gold instead of silver or copper. Alternatively, the bonding parts 25 may contain Ag—Pt or Ag—Pd. The method for forming the bonding parts 25 is not limited. For example, as with the conductive parts 3, the bonding parts 25 may be formed by baking a paste containing these metals. The thickness of the bonding parts 25 is not limited and may be about 5 to 30 μm, for example.

In the present embodiment, as shown in FIG. 10, the bonding parts 25 include two bonding parts 251, two bonding parts 252, two bonding parts 253 and one bonding part 254. The bonding parts 251, 252, 253 and 254 are spaced apart from each other. The two bonding parts 251 are formed at locations close to the opposite ends in the x direction on the substrate front surface 21. A lead 11 (described later) is bonded to each of the bonding parts 251. The bonding part 254 is formed at the center in the x direction on the substrate front surface 21. A lead 14 (described later) is bonded to the bonding part 254. One of the bonding parts 253 is formed between one of the bonding parts 251 (on the right in FIG. 10) and the bonding part 254 in the x direction on the substrate front surface 21. The other bonding part 253 is formed between the other bonding part 251 (on the left in FIG. 10) and the bonding part 254 in the x direction on the substrate front surface 21. A lead 13 (described later) is bonded to each of the bonding parts 253. One of the bonding parts 252 is formed to surround one of the bonding parts 253 between one of the bonding parts 251 and the bonding part 254. The other bonding part 252 is formed to surround the other one of the bonding parts 253 between the other bonding part 251 and the bonding part 254. A lead 12 (described later) is bonded to each of the bonding parts 252. Note that the shape and arrangement of the bonding parts 251, 252, 253 and 254 are not limited.

The leads 1 contain a metal and have a thermal conductivity higher than that of the substrate 2, for example. The metal forming the leads 1 is not limited and may be copper (Cu), aluminum, iron (Fe), oxygen-free copper, or their alloys (e.g., Cu—Sn alloy, Cu—Zr alloy or Cu—Fe alloy), for example. The leads 1 may be plated with nickel (Ni). The leads 1 may be formed by press working in which a die is pressed against a metal plate or by patterning a metal plate by etching. The method for forming the leads 1 is not limited. The thickness of each lead 1 is not limited and may be about 0.4 to 0.8 mm, for example. The leads 1 are spaced apart from each other.

In the present embodiment, the leads 1 include two leads 11, two leads 12, two leads 13, one lead 14 and a plurality of leads 15. The leads 11, the leads 12, the leads 13 and the lead 14 constitute conduction paths to the semiconductor chips 4. The leads 15 constitute conduction paths to the control units 5 or the passive elements 6.

The two leads 11 are disposed on the substrate 2, and on the substrate front surface 21 in the present embodiment. The leads 11 are an example of "third lead". Each of the leads 11 is bonded to a relevant bonding part 25 via a bonding material 75. The bonding material 75 may be any material capable of bonding the lead 11 to the bonding part 25. To efficiently dissipate heat from the lead 11 to the substrate 2, a material with high thermal conductivity is preferable, and use may be made of silver paste, copper paste or solder, for example. However, the bonding material 75 may be an insulating material such as epoxy resin or silicone resin. When the substrate 2 is formed with no bonding parts 25, the leads 11 may be directly bonded to the substrate 2. Each lead 11 is bonded to a bonding part 251. To distinguish between the two leads 11, the lead bonded to one of the bonding parts 251 (the right bonding part 251 in FIG. 10) is referred to as lead 11a, and the lead bonded to the other bonding part 251 (the left bonding part 251 in FIG. 10) is referred to as lead 11b. A semiconductor chip 4a is bonded to the lead 11a, and a semiconductor chip 4c is bonded to the lead 11b.

The configuration of the leads 11 is not limited. In the description of the present embodiment, the lead 11 is divided into a bonded part 111, a projecting part 112, an inclined connection part 113 and a parallel connection part 114, as shown in FIG. 5.

The bonded part 111 has a front surface 111a and a back surface 111b. The front surface 111a and the back surface 111b face away from each other in the z direction and are both flat surfaces orthogonal to the z direction. The front surface 111a faces upward in FIG. 5. The semiconductor chip 4 is bonded to the front surface 111a. The back surface 111b faces downward in FIG. 5. The back surface 111b is bonded to a bonding part 25 with the bonding material 75. The inclined connection part 113 and the parallel connection part 114 are covered with the sealing resin 8. The inclined connection part 113 is connected to the bonded part 111 and the parallel connection part 114 and inclined with respect to the bonded part 111 and the parallel connection part 114. The parallel connection part 114 is connected to the inclined connection part 113 and the projecting part 112 and parallel to the bonded part 111. The projecting part 112 is connected to an end of the parallel connection part 114 and is a part of the lead 11 that projects from the sealing resin 8. The projecting part 112 projects to an opposite side to the bonded part 111 in the y direction. The projecting part 112 is used, for example, to electrically connect the semiconductor device A1 to an external circuit. In the illustrated example, the projecting part 112 is bent toward the side which the front surface 111a of the bonded part 111 faces in the z direction.

The two leads 12 are disposed on the substrate 2, and on the substrate front surface 21 in the present embodiment. The leads 12 are an example of "third lead". Each of the leads 12 is bonded to a relevant bonding part 252 via a bonding material 75. To distinguish between the two leads 12, the lead bonded to one of the bonding parts 252 (the right bonding part 252 in FIG. 10) is referred to as lead 12a, and the lead bonded to the other bonding part 252 (the left bonding part 252 in FIG. 10) is referred to as lead 12b. The configuration of the leads 12 is not limited. In the present embodiment, the configuration of the leads 12 is the same as that of the leads 11. A semiconductor chip 4b is bonded to the lead 12a, and a semiconductor chip 4d is bonded to the lead 12b.

The two leads 13 are disposed on the substrate 2, and on the substrate front surface 21 in the present embodiment. Each of the leads 13 is bonded to a relevant bonding part 253 via a bonding material 75. To distinguish between the two leads 13, the lead bonded to one of the bonding parts 253 (the right bonding part 253 in FIG. 10) is referred to as lead 13a, and the lead bonded to the other bonding part 253 (the left bonding part 253 in FIG. 10) is referred to as lead 13b. The configuration of the leads 13 is not limited. In the present embodiment, the configuration of the leads 13 is the same as that of the leads 11. No semiconductor chips 4 are bonded to the leads 13.

The lead 14 are disposed on the substrate 2, and on the substrate front surface 21 in the present embodiment. The lead 14 is bonded to the bonding part 254 via a bonding material 75. The configuration of the lead 14 is not limited.

In the present embodiment, the configuration of the lead 14 is the same as that of the leads 11. No semiconductor chips 4 are bonded to the lead 14.

The plurality of leads 15 are disposed on the substrate 2, and on the substrate front surface 21 in the present embodiment. The leads 15 are bonded to the pads 32 of the conductive part 3 via the conductive bonding materials 76. The conductive bonding materials 76 may be any material capable of bonding the leads 15 to the pads 32 and electrically connecting the leads 15 and the pads 32. Examples of the conductive bonding materials 76 include silver paste, copper paste or solder. Each lead 15 has a strip-like shape as a whole.

The configuration of the leads 15 is not limited. In the description of the present embodiment, each lead 15 is divided into a bonded part 151, a projecting part 152, an inclined connection part 153 and a parallel connection part 154, as shown in FIG. 5.

The bonded part 151 has a front surface 151*a* and a back surface 151*b*. The front surface 151*a* and the back surface 151*b* face away from each other in the z direction and are both flat surfaces orthogonal to the z direction. The front surface 151*a* faces upward in FIG. 5. The back surface 151*b* faces downward in FIG. 5. The back surface 151*b* is bonded to a pad 32 with the conductive bonding material 76. The inclined connection part 153 and the parallel connection part 154 are covered with the sealing resin 8. The inclined connection part 153 is connected to the bonded part 151 and the parallel connection part 154 and inclined with respect to the bonded part 151 and the parallel connection part 154. The parallel connection part 154 is connected to the inclined connection part 153 and the projecting part 152 and parallel to the bonded part 151. The projecting part 152 is connected to an end of the parallel connection part 154 and is a part of the lead 15 that projects from the sealing resin 8. The projecting part 152 projects to an opposite side to the bonded part 151 in the y direction. The projecting part 152 is used, for example, to electrically connect the semiconductor device A1 to an external circuit. In the illustrated example, the projecting part 152 is bent toward the side which the front surface 151*a* of the bonded part 151 faces in the z direction.

As shown in FIGS. 3 and 6-9, the leads 15 include leads 15*a*, 15*b*, 15*c* and 15*d*. Each of the leads 15*a*, 15*b*, 15*c* and 15*d* is bonded to two pads 32 disposed apart from each other. The leads 15*a*, 15*b*, 15*c* and 15*d* are an example of "first lead".

Figure 6:
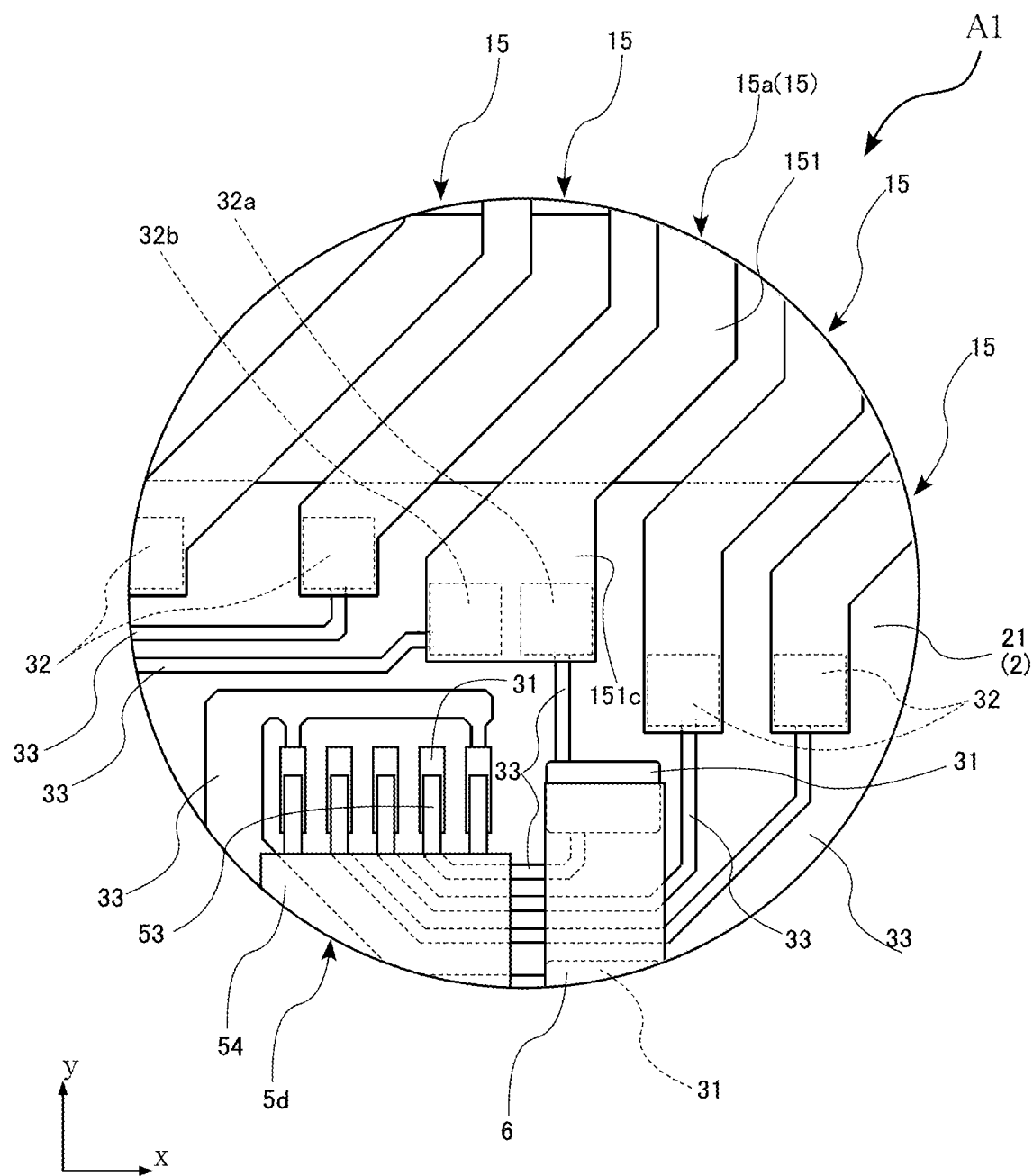
FIG. 6 is an enlarged view showing a portion of FIG. 3.

As shown in FIG. 6, the lead 15*a* is bonded to both of the pad 32*a* and the pad 32*b*. The pad 32*a* and the pad 32*b* are examples of "first pad" and "second pad", respectively. The bonded part 151 of the lead 15*a* has a wide portion 151*c* at the end opposite the projecting part 152. The wide portion 151*c* is more than twice as wide as other portions. The pad 32*a* and the pad 32*b* are aligned in the x direction at the first end in the y direction (upper end in FIG. 6) on the substrate front surface 21 and bonded to the wide portion 151*c* of the lead 15*a*. The pad 32*a* is electrically connected, via a connecting conductor 33 and a pad 31, to a lead 53 (described later) that is the analog power supply terminal of a control unit 5*d* (described later). The pad 32*b* is electrically connected, via a connecting conductor 33 and a pad 31, to a lead 53 that is the analog power supply terminal of a control unit 5*c* (described later). That is, the lead 15*a* is electrically connected to respective analog power supply terminals of the control unit 5*c* and the control unit 5*d*.

Figure 8:
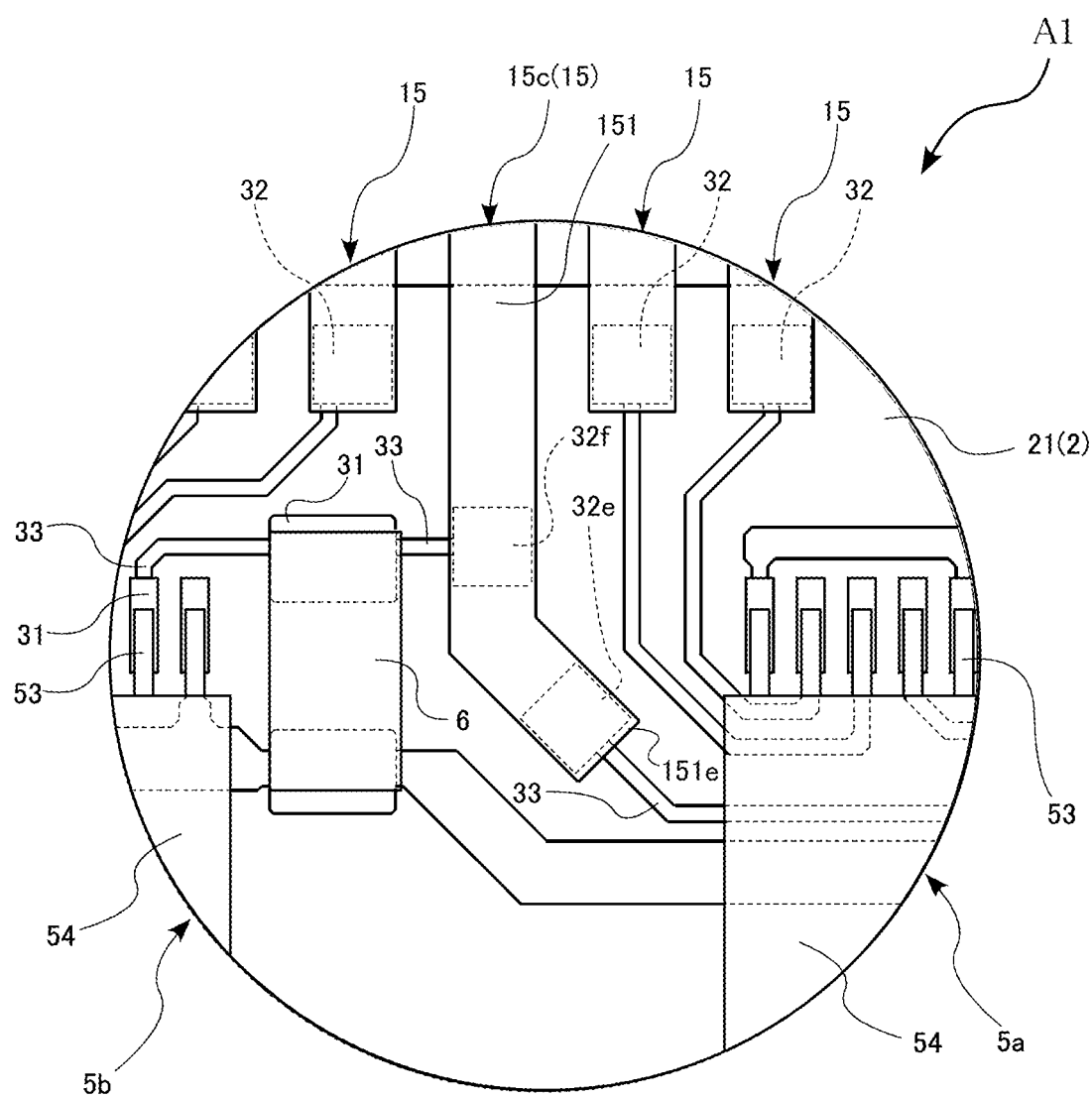
FIG. 8 is an enlarged view showing a portion of FIG. 3.
Figure 8:
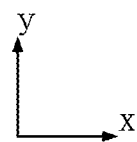

As shown in FIG. 8, the lead 15*c* is bonded to both of the pad 32*e* and the pad 32*f*. The pad 32*e* and the pad 32*f* are examples of "first pad" and "second pad", respectively. As shown in FIG. 5, the bonded part 151 of the lead 15*c* has a first end 151*d* closer to the projecting part 152 and a second end 151*e* farther from the projecting part 152. The pad 32*e* and the pad 32*f* are disposed near the first end in the y direction (upper end in FIG. 8) on the substrate front surface 21 in a manner such that they are arranged along a direction that is slightly inclined with respect to the y direction, or along a direction in which the first end 151*d* and the second end 151*e* of the lead 15*c* are spaced apart from each other. The pad 32*e* is bonded to the second end 151*e*, and the pad 32*f* is bonded between the first end 151*d* and the second end 151*e*. The pad 32*e* is electrically connected, via a connecting conductor 33 and a pad 31, to a lead 53 that is the analog power supply terminal of a control unit 5*a* (described later). The pad 32*f* is electrically connected, via a connecting conductor 33 and a pad 31, to a lead 53 that is the analog power supply terminal of a control unit 5*b* (described later). That is, the lead 15*c* is electrically connected to respective analog power supply terminals of the control unit 5*a* and the control unit 5*b*.

Figure 7:
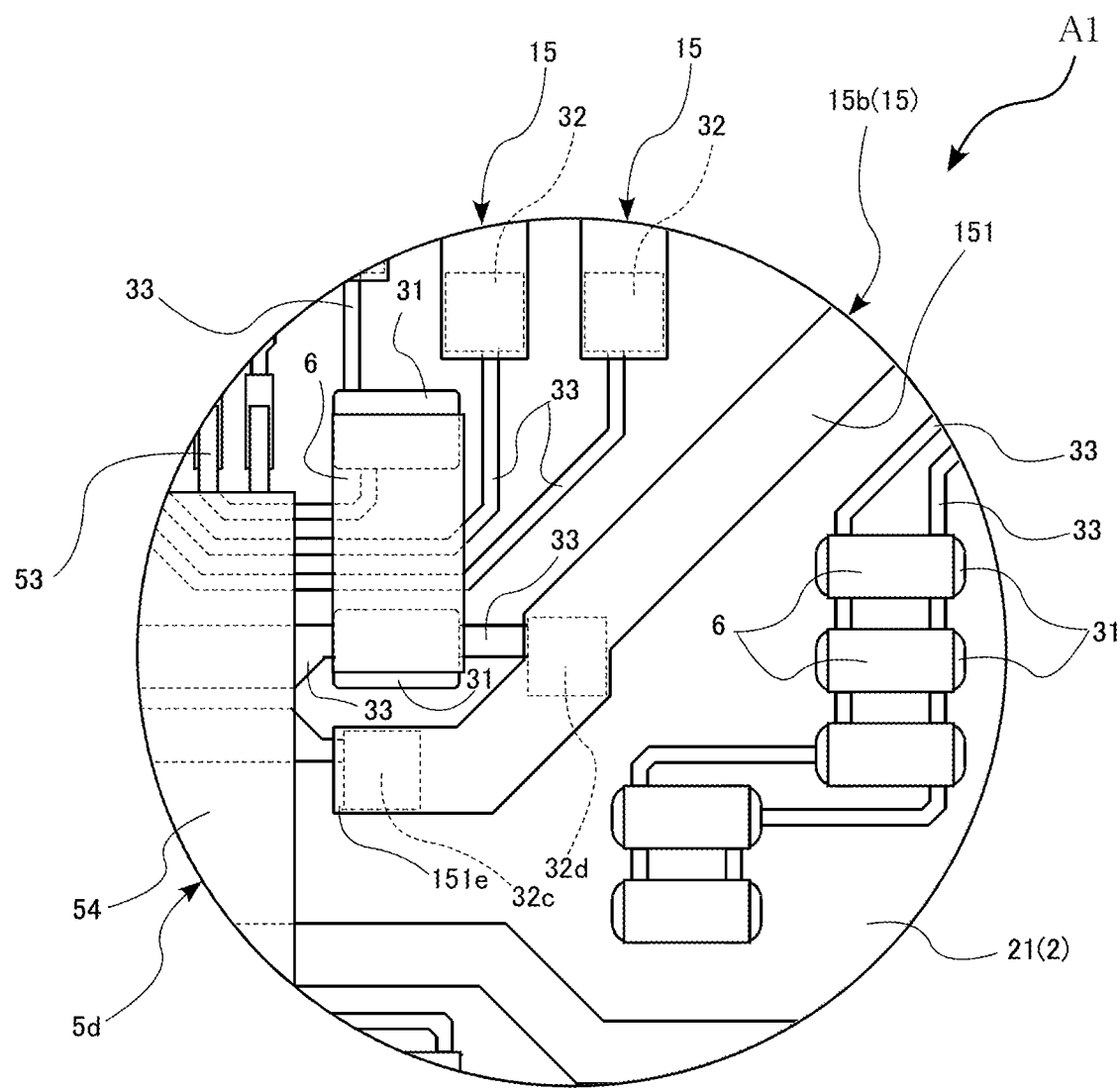
FIG. 7 is an enlarged view showing a portion of FIG. 3.

As shown in FIG. 7, the lead 15*b* is bonded to both of the pad 32*c* and the pad 32*d*. The pad 32*c* and the pad 32*d* are examples of "first pad" and "second pad", respectively. As with the bonded part 151 of the lead 15*c*, the bonded part 151 of the lead 15*b* has a first end 151*d* closer to the projecting part 152 and a second end 151*e* farther from the projecting part 152. The pad 32*c* and the pad 32*d* are disposed near the first end in the y direction (upper end in FIG. 7) on the substrate front surface 21 in a manner such that they are arranged along a direction that is slightly inclined with respect to the x direction, or along a direction in which the first end 151*d* and the second end 151*e* of the lead 15*b* are spaced apart from each other. The pad 32*c* is bonded to the second end 151*e*, and the pad 32*d* is bonded between the first end 151*d* and the second end 151*e*. The pad 32*c* is electrically connected, via a connecting conductor 33 and a pad 31, to a lead 53 that is the ground terminal of the control unit 5*c*. The pad 32*d* is electrically connected, via a connecting conductor 33 and a pad 31, to a lead 53 that is the ground terminal of the control unit 5*d*. That is, the lead 15*b* is electrically connected to respective ground terminals of the control unit 5*c* and the control unit 5*d*.

Figure 9:
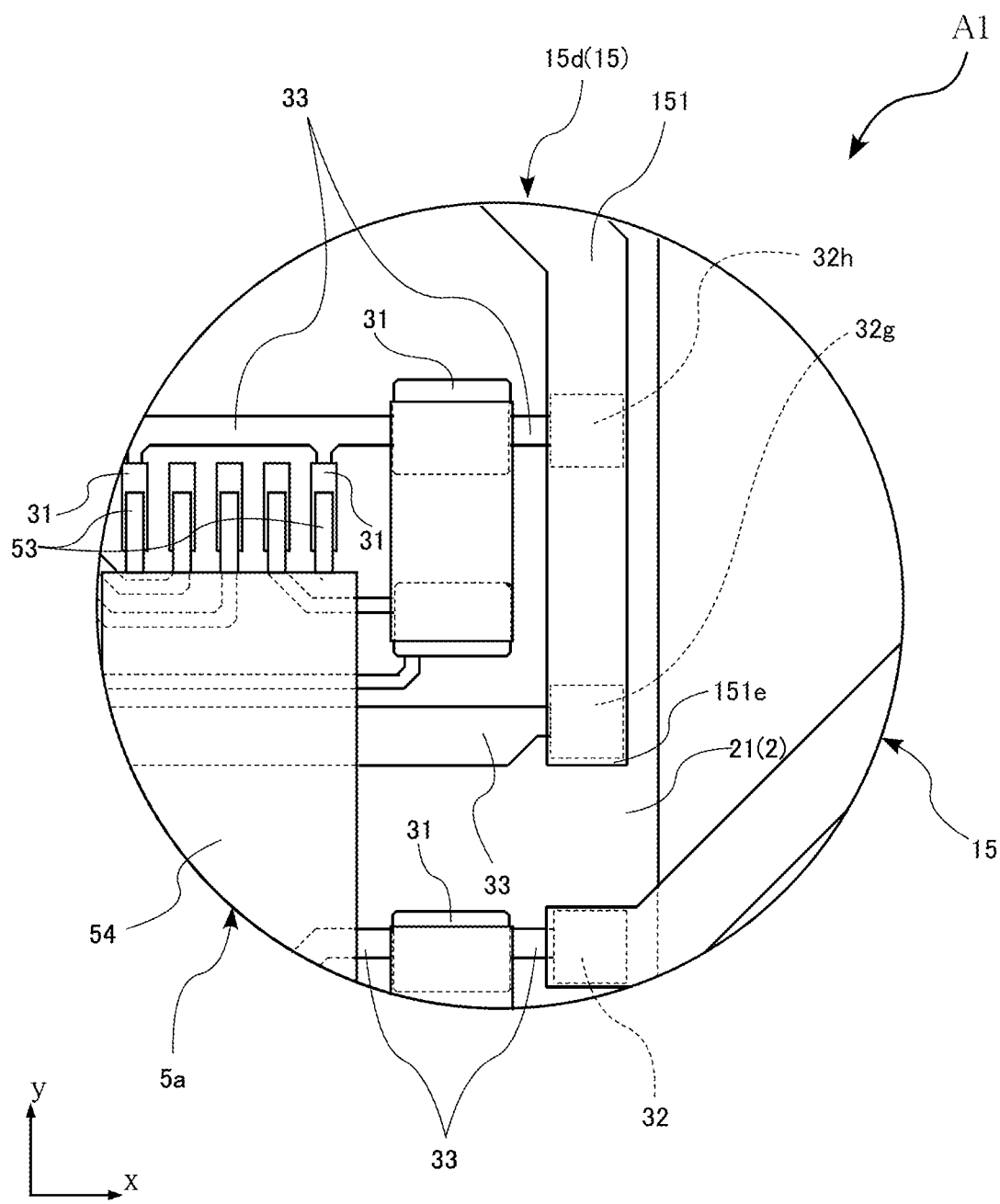
FIG. 9 is an enlarged view showing a portion of FIG. 3.
Figure 10:
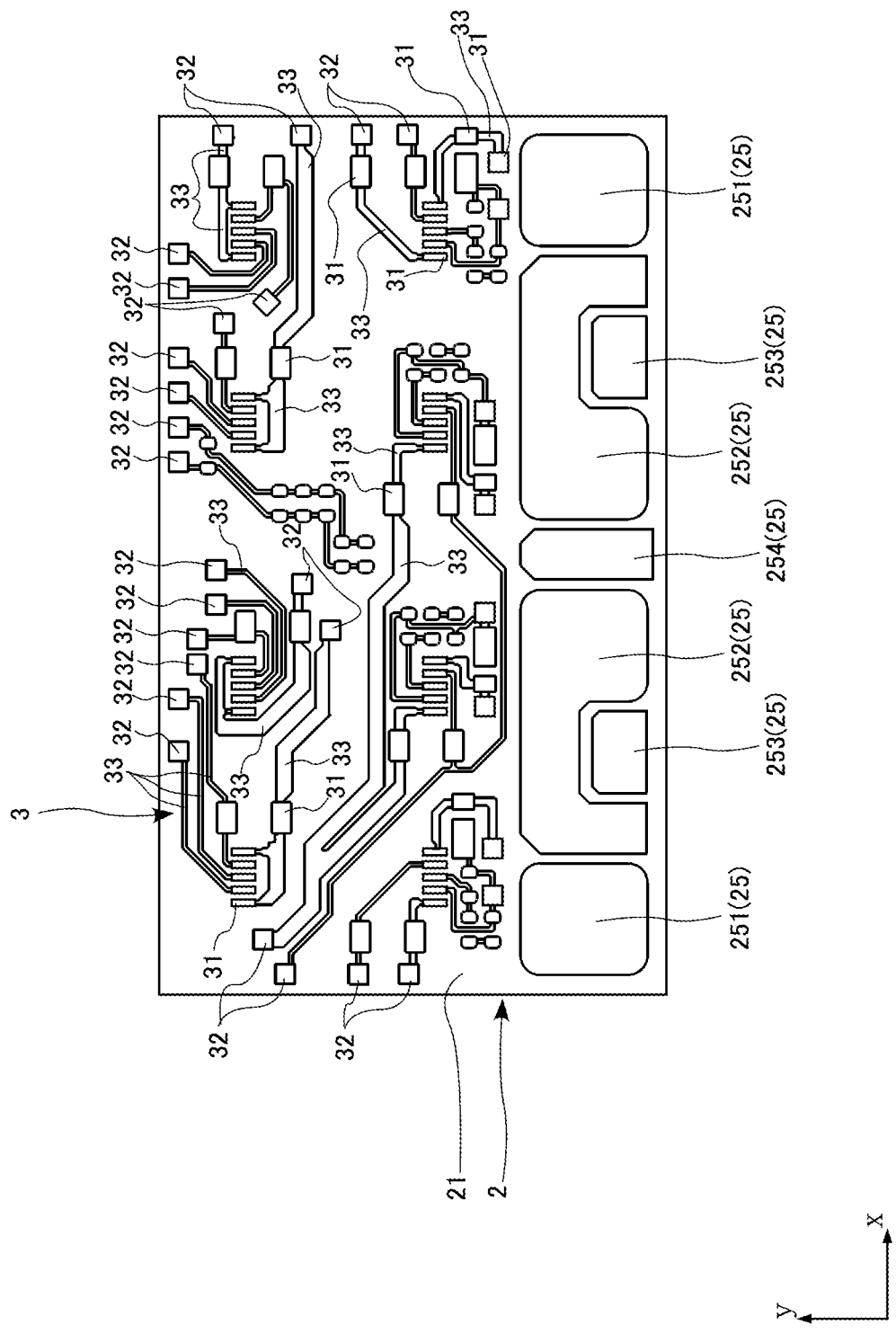
FIG. 10 is a plan view showing a substrate.

As shown in FIG. 9, the lead 15*d* is bonded to both of the pad 32*g* and the pad 32*h*. The pad 32*g* and the pad 32*h* are examples of "first pad" and "second pad", respectively. As with the bonded part 151 of the lead 15*c*, the bonded part 151 of the lead 15*d* has a first end 151*d* closer to the projecting part 152 and a second end 151*e* farther from the projecting part 152. The pad 32*g* and the pad 32*h* are disposed near one end in the x direction (right end in FIG. 9) on the substrate front surface 21 in a manner such that they are arranged along the y direction, or along a direction in which the first end 151*d* and the second end 151*e* of the lead 15*d* are spaced apart from each other. The pad 32*g* is bonded to the second end 151*e*, and the pad 32*h* is bonded between the first end 151*d* and the second end 151*e*. The pad 32*g* is electrically connected, via a connecting conductor 33 and a pad 31, to a lead 53 that is the ground terminal of the control unit 5*b*. The pad 32*h* is electrically connected, via a connecting conductor 33 and a pad 31, to a lead 53 that is the ground terminal of the control unit 5*a*. That is, the lead 15*d* is electrically connected to respective ground terminals of the control unit 5*a* and the control unit 5*b*.

The shape of the bonded part 151 of each lead 15 is designed appropriately in accordance with the arrangement of the pad 32 to be bonded. The shape of the bonded part 151 of each of the leads 15a, 15b, 15c and 15d is designed appropriately in accordance with the arrangement of the two pads 32 to be bonded.

Each of the four semiconductor chips 4 is disposed on one of the leads 1. When the four semiconductor chips 4 are described separately, they are referred to as semiconductor chip 4a, semiconductor chip 4b, semiconductor chip 4c and semiconductor chip 4d. When the semiconductor chips are described collectively, they are simply referred to as semiconductor chips 4. The type or function of the semiconductor chips 4 is not limited. In the present embodiment, the case where the semiconductor chips 4 are power transistors for controlling electric power is described. The semiconductor chips 4 are MOSFETs (metal-oxide-semiconductor field-effect transistors) made of a SiC (silicon carbide) substrate, for example. The semiconductor chips 4 may be MOSFETs made of a Si (silicon) substrate rather than a SiC substrate, and may include an IGBT, for example. The semiconductor chips may be MOSFETs containing GaN (gallium nitride). Although the semiconductor device A1 has four semiconductor chips 4 in the present embodiment, this is one example, and the number of the semiconductor chips 4 is not limited.

Each of the semiconductor chips 4 is in the form of a plate that is rectangular as viewed in the z direction and has an element front surface 41, an element back surface 42, a source electrode 43, a gate electrode 44 and a drain electrode 45. The element front surface 41 and the element back surface 42 face away from each other in the z direction. The front surface 41 faces upward in FIG. 5. The back surface 42 faces downward in FIG. 5. As shown in FIG. 3, the source electrode 43 and the gate electrode 44 are disposed on the element front surface 41. The drain electrode 45 is disposed on the element back surface 42. The shape and arrangement of the source electrode 43, the gate electrode 44 and the drain electrode 45 are not limited.

As shown in FIGS. 3 and 5, the semiconductor chip 4a is disposed on the lead 11a. As shown in FIG. 5, the semiconductor chip 4a is bonded to the lead 11a with a conductive bonding material (not shown), with the element back surface 42 facing the lead 11a. Thus, the drain electrode 45 of the semiconductor chip 4a is electrically connected to the lead 11a by the conductive bonding material. For example, as the conductive bonding material, use may be made of silver paste, copper paste or solder. As shown in FIG. 3, the source electrode 43 of the semiconductor chip 4a is electrically connected to the lead 12a with the wires 71. The wires 71 are made of aluminum (Al) or copper (Cu), for example. The material, diameter and number of the wires 71 are not limited. As shown in FIG. 3, the semiconductor chip 4b is disposed on the lead 12a. The semiconductor chip 4b is bonded to the lead 12a with a conductive bonding material (not shown), with the element back surface 42 facing the lead 12a. Thus, the drain electrode 45 of the semiconductor chip 4b is electrically connected to the lead 12a by the conductive bonding material. The source electrode 43 of the semiconductor chip 4b is electrically connected to the lead 14 with the wires 71. With such an arrangement, a bridge circuit is formed in which the source electrode 43 of the semiconductor chip 4a and the drain electrode 45 of the semiconductor chip 4b are connected.

As shown in FIG. 3, the source electrode 43 and the gate electrode 44 of the semiconductor chip 4a are electrically connected to the control unit 5a via the wires 72 and the conductive part 3. The wires 72 are made of gold (Au), silver (Ag), copper (Cu) or aluminum (Al), for example. The material, diameter and number of the wires 72 are not limited. The control unit 5a inputs a drive signal to the gate electrode 44 of the semiconductor chip 4a. The source electrode 43 and the gate electrode 44 of the semiconductor chip 4b are electrically connected to the control unit 5b via the wires 72 and the conductive part 3. The control unit 5b inputs a drive signal to the gate electrode 44 of the semiconductor chip 4b. When a DC voltage is applied between the lead 11a and the lead 14 and a drive signal is input to the respective gate electrodes 44 of the semiconductor chips 4a and 4b, a switching signal whose voltage changes in accordance with the drive signal is output from the lead 12a.

As shown in FIG. 3, the semiconductor chip 4c is disposed on the lead 11b. The semiconductor chip 4c is bonded to the lead 11b with a conductive bonding material (not shown), with the element back surface 42 facing the lead 11b. Thus, the drain electrode 45 of the semiconductor chip 4c is electrically connected to the lead 11b by the conductive bonding material. The source electrode 43 of the semiconductor chip 4c is electrically connected to the lead 12 with the wires 71. As shown in FIG. 3, the semiconductor chip 4d is disposed on the lead 12b. The semiconductor chip 4d is bonded to the lead 12b with a conductive bonding material (not shown), with the element back surface 42 facing the lead 12b. Thus, the drain electrode 45 of the semiconductor chip 4d is electrically connected to the lead 12b by the conductive bonding material. The source electrode 43 of the semiconductor chip 4d is electrically connected to the lead 14 with the wires 71. With such an arrangement, a bridge circuit is formed in which the source electrode 43 of the semiconductor chip 4c and the drain electrode 45 of the semiconductor chip 4d are connected.

The source electrode 43 and the gate electrode 44 of the semiconductor chip 4c are electrically connected to the control unit 5c via the wires 72 and the conductive part 3. The control unit 5c inputs a drive signal to the gate electrode 44 of the semiconductor chip 4c. The source electrode 43 and the gate electrode 44 of the semiconductor chip 4d are electrically connected to the control unit 5d via the wires 72 and the conductive part 3. The control unit 5d inputs a drive signal to the gate electrode 44 of the semiconductor chip 4d. When a DC voltage is applied between the lead 11b and the lead 14 and a drive signal is input to the respective gate electrodes 44 of the semiconductor chips 4c and 4d, a switching signal whose voltage changes in accordance with the drive signal is output from the lead 12b.

The four control units 5, each of which controls the driving of the relevant semiconductor chip 4, are disposed on the substrate front surface 21 of the substrate 2. When the four control units are described separately, they are referred to as control unit 5a, control unit 5b, control unit 5c and control unit 5d. When the control units are described collectively, they are simply referred to as control units 5. The control unit 5a controls the driving of the semiconductor chip 4a. The control unit 5b controls the driving of the semiconductor chip 4b. The control unit 5c controls the driving of the semiconductor chip 4c. The control unit 5d controls the driving of the semiconductor chip 4d. As shown in FIG. 5, the control units 5 are located between the semiconductor chips 4 and the leads 15, as viewed in the x direction. As shown in FIG. 3, as viewed in the y direction, the control unit 5a overlaps with the semiconductor chip 4a, the control unit 5b overlaps with the semiconductor chip 4b, the control unit 5c overlaps with the semiconductor chip 4c, and the control unit 5d overlaps with the semiconductor chip 4d. The arrangement of the control units 5a-5d is not limited.

Each of the control units 5 has a control chip, a die pad and a plurality of wires (not shown), as well as a plurality of leads 53 and a resin 54. The control chip is an integrated circuit that controls the driving of the semiconductor chip 4 and outputs a drive signal to drive the semiconductor chip 4. The die pad and the leads 53 are plate-like members made of copper (Cu), for example. The control chip is mounted on the die pad. Each of the leads 53 is electrically connected to the control chip with a wire. The resin 54 covers the entirety of the control chip and wires as well as a portion of each lead 53, and is made of an insulating material such as epoxy resin or silicone gel, for example.

As shown in FIGS. 6-9, the leads 53 are disposed at opposite ends of the resin 54 in the y direction, with a spacing in the x direction. The leads 53 extend along the y direction and partially project from respective end surfaces of the resin 54 in the y direction. The portion of each lead 53 that projects from the resin 54 is conductively bonded to a pad 31 of the conductive part 3. In the present embodiment, the control units 5 are of a SOP (Small Outline Package) type. The package type of the control units 5 is not limited to the SOP, but may be other types such as QFP (Quad Flat Package) or SOJ (Small Outline J-lead Package). Each lead 53 is bonded to a pad 31 of the conductive part 3 via the conductive bonding material 76.

The size and shape of the control units 5 and the number of the leads are not limited. Each control unit 5 may have a plurality of control chips or a circuit chip other than a control chip.

In the present embodiment, some of the connecting conductors 33 overlap with the control units 5 as viewed in the z direction and are disposed between the substrate front surface 21 of the substrate 2 and the surfaces of the control units 5 that face the substrate front surface. Since the control chips of the control units 5 are covered with the resin 54, the control chips are prevented from coming into contact with the connecting conductors 33. Unlike this, when the control chips are disposed directly on the substrate 2, the connecting conductors 33 need to be arranged to detour the control units 5, because the control chips would come into contact with the connecting conductors 33 if the connecting conductors 33 are so disposed as to overlap with the control units 5.

The passive elements 6 are disposed on the substrate front surface 21 of the substrate 2 and conductively bonded to the conductive part 3 or the leads 1. The passive elements 6 may be a resistor, a capacitor, a coil or a diode, for example. The passive elements 6 include shunt resistors 6a.

The shunt resistors 6a each are disposed to straddle a lead 12 and a lead 13 and conductively bonded to the lead 12 and the lead 13. The shunt resistors 6a cause the current shunted from the current flowing in the leads 12 to be output from leads 13.

Other passive elements 6 are conductively bonded to the pads 31 of the conductive part 3 and electrically connected to the control units 5 via the connecting conductors 33 and the pads 31 or electrically connected to the leads 15 via the connecting conductors 33 and the pad 32. The type, arrangement position and number of the passive elements 6 are not limited.

The sealing resin 8 covers the entirety of the four semiconductor chips 4, four control units 5, passive elements 6 and wires 71, 72 as well as a portion of each lead 1 and at least a portion of the substrate 2. The material for the sealing resin 8 is not limited, and an insulating material such as epoxy resin or silicone gel, for example, may be used.

The sealing resin 8 has a resin front surface 81, a resin back surface 82 and four resin side surfaces 83. The resin front surface 81 and the resin back surface 82 face away from each other in the z direction and are both flat surfaces orthogonal to the z direction. The resin front surface 81 faces upward in FIG. 5. The resin back surface 82 faces upward in FIG. 5. Each of the resin side surfaces 83 is connected to the resin front surface 81 and the resin back surface 82 and faces in the x direction or the y direction. As shown in FIG. 4, the substrate back surface 22 of the substrate 2 is exposed from the resin back surface 82 of the sealing resin 8. In the present embodiment, the substrate back surface 22 and the resin back surface 82 are flush with each other, as shown in FIG. 5.

An example of a method for manufacturing the semiconductor device A1 is described below with reference to FIG. 11. The manufacturing method described below is merely one example for realizing the semiconductor device A1, and the manufacturing method of the present disclosure is not limited to this.

Figure 11:
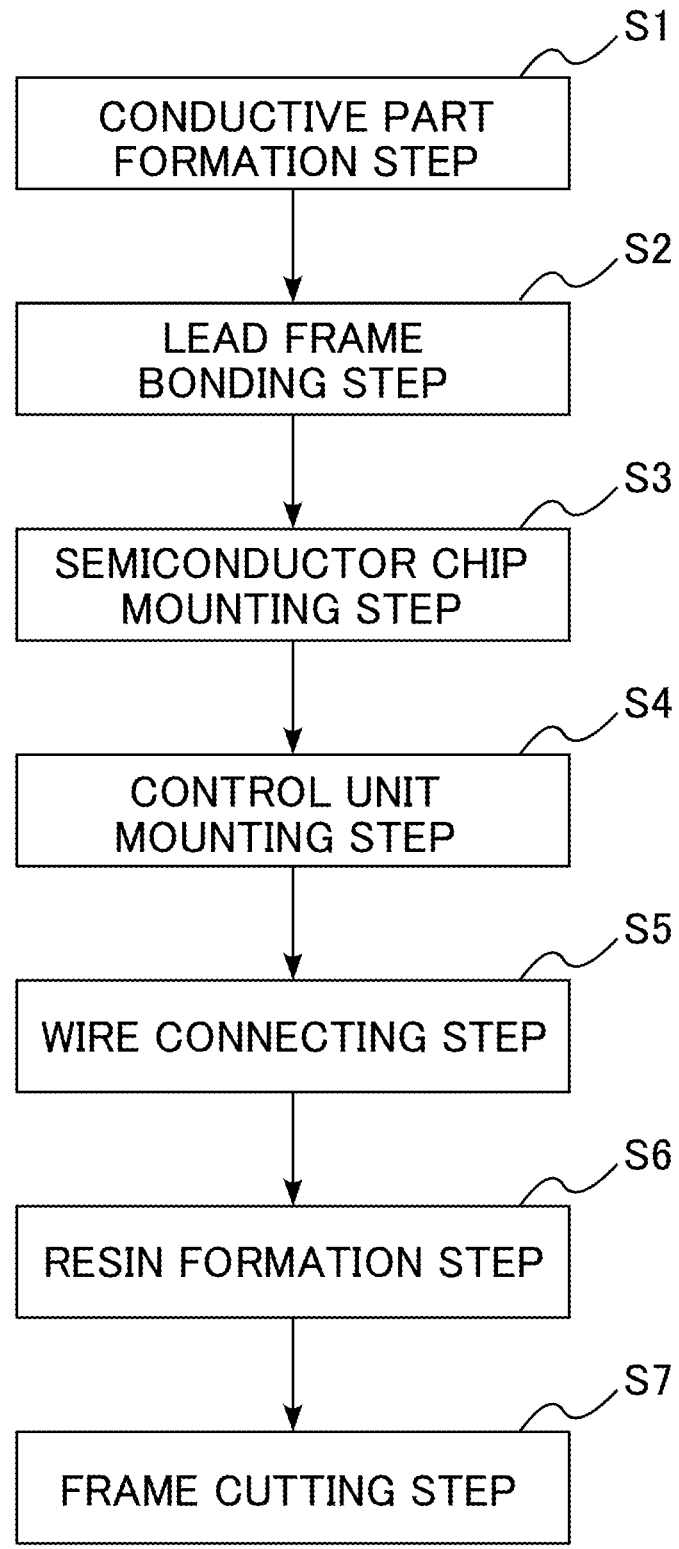
FIG. 11 is a view showing an example of a method for manufacturing the semiconductor device of FIG. 1.

As shown in FIG. 11, the manufacturing method of the present example includes a conductive part formation step (Step S1), a lead frame bonding step (Step S2), a semiconductor chip mounting step (Step S3), a control unit mounting step (Step S4), a wire connecting step (Step S5), a resin formation step (Step S6) and a frame cutting step (Step S7).

In the conductive part formation step (Step S1), a substrate 2 is first prepared. The substrate 2 is made of ceramics, for example. Next, a conductive part 3 and a plurality of bonding parts 25 are formed on the substrate front surface 21 of the substrate 2. In the present example, the conductive part 3 and the bonding parts 25 are formed at once. For example, a metal paste is printed and then baked, whereby the conductive part 3 and bonding parts 25 containing a metal such as silver (Ag) as the conductive material are obtained.

In the lead frame bonding step (Step S2), a bonding paste is printed on the bonding parts 25, and a conductive bonding paste is printed on the pads 32 of the conductive part 3. The bonding paste and the conductive bonding paste are Ag paste or solder paste, for example. Next, a lead frame is prepared. The lead frame includes a plurality of leads 1 and has a frame part to which the leads 1 are connected. The shape of the lead frame is not limited. Next, of the leads 1, the leads 11, 12, 13 and 14 are placed to face the bonding parts 25 via the bonding paste. Also, of the leads 1, the leads 15 are placed to face the conductive part 3 (pads 32) via the conductive bonding paste. The bonding paste and the conductive bonding paste are, for example, heated and then cooled, so that the bonding paste becomes the bonding material 75, and the conductive bonding paste becomes the conductive bonding material 76. In this way, the leads 11, 12, 13 and 14 are bonded to the bonding parts 25 via the bonding material 75, and the leads 15 are bonded to the conductive part 3 via the conductive bonding material 76.

In the semiconductor chip mounting step (Step S3), a conductive bonding paste is printed on predetermined positions on the leads 11a, 11b and the leads 12a, 12b. The conductive bonding paste is Ag paste or solder paste, for example. Next, a semiconductor chip 4a is adhered to the conductive bonding paste printed on the lead 11a, and likewise a semiconductor chip 4b to the conductive bonding paste printed on the lead 12a, a semiconductor chip 4c to the conductive bonding paste printed on the lead 11b, and a semiconductor chip 4d to the conductive bonding paste printed on the lead 12b. Next, the conductive bonding paste is, for example, heated and then cooled, so that the conductive bonding paste becomes the conductive bonding material. In this way, the semiconductor chip 4a is bonded to the lead 11a via the conductive bonding material, the semiconductor chip 4b is bonded to the lead 12a via the conductive bonding material, the semiconductor chip 4c is bonded to the lead 11b via the conductive bonding material, and the semiconductor chip 4d is bonded to the lead 12b via the conductive bonding material. Also, by the same process, each of the shunt resistors 6a is bonded to the lead 12a and the lead 13a or to the lead 12b and the lead 13b via the conductive bonding material.

In the control unit mounting step (Step S4), a conductive bonding paste is printed on the pads 31 of the conductive part 3. The conductive bonding paste is Ag paste or solder paste, for example. Next, respective leads 53 of the control units 5a-5d are adhered to the conductive bonding paste. Next, the conductive bonding paste is, for example, heated and then cooled, to cause the leads 53 of the control units 5a-5d to be bonded to the pads 31 via the conductive bonding material. Also, by the same process, other passive elements 6 are bonded to the pads 31 of the conductive part 3 via the conductive bonding material.

In the wire connecting step (Step S5), a plurality of wires 71 are first connected. In the present example, wire materials made of aluminum (Al) are sequentially connected by wedge bonding, for example. In this way, the wires 71 are provided. Next, a plurality of wires 72 are connected. In the present example, wire materials made of gold (Au) are sequentially connected by capillary bonding, for example. In this way, the wires 72 are provided.

In the resin formation step (Step S6), a portion of the lead frame, a portion of the substrate 2, the semiconductor chips 4a-4d, the control units 5a-5d, the passive elements 6 and the wires 71, 72 are enclosed in a mold. Next, liquid resin material is injected into the space defined by the mold. The resin material is then hardened to provide the sealing resin 8.

In the frame cutting step (Step S7), portions of the lead frame that are exposed from the sealing resin 8 are cut as appropriate. In this way, the leads 1 are separated from each other. Thereafter, process steps such as bending the leads 1 are performed as required, whereby the semiconductor device A1 described above is obtained.

The advantages of the semiconductor device A1 are described below.

According to the present embodiment, a conductive part 3 is formed on the substrate front surface 21 of the substrate 2. The conductive part 3 has pads 31, to which the control units 5 are conductively bonded. With such an arrangement, the conduction paths to the control units 5 can be constituted by the conductive part 3 formed on the substrate front surface 21. Thus, it is possible to provide thinner and denser conduction paths as compared with the case where such conduction paths are constituted by metal leads. The lead 15a is bonded to each of the pad 32a and the pad 32b via the conductive bonding material 76. With such an arrangement, the noise input from the control unit 5d to the pad 32a via a connecting conductor 33 is released from the lead 15a to the outside. Thus, such noise is prevented from being input to the control unit 5c via the pad 32b and the connecting conductor 33 connected to the pad. Thus, as compared with a case where the lead 15 is connected to a single pad 32 that doubles as the pad 32a and the pad 32b, the effects of noise are reduced. The same holds true for the pad 32c and the pad 32d bonded to the lead 15b, the pad 32e and the pad 32f bonded to the lead 15c, and the pad 32g and the pad 32h bonded to the lead 15d.

Figure 12:
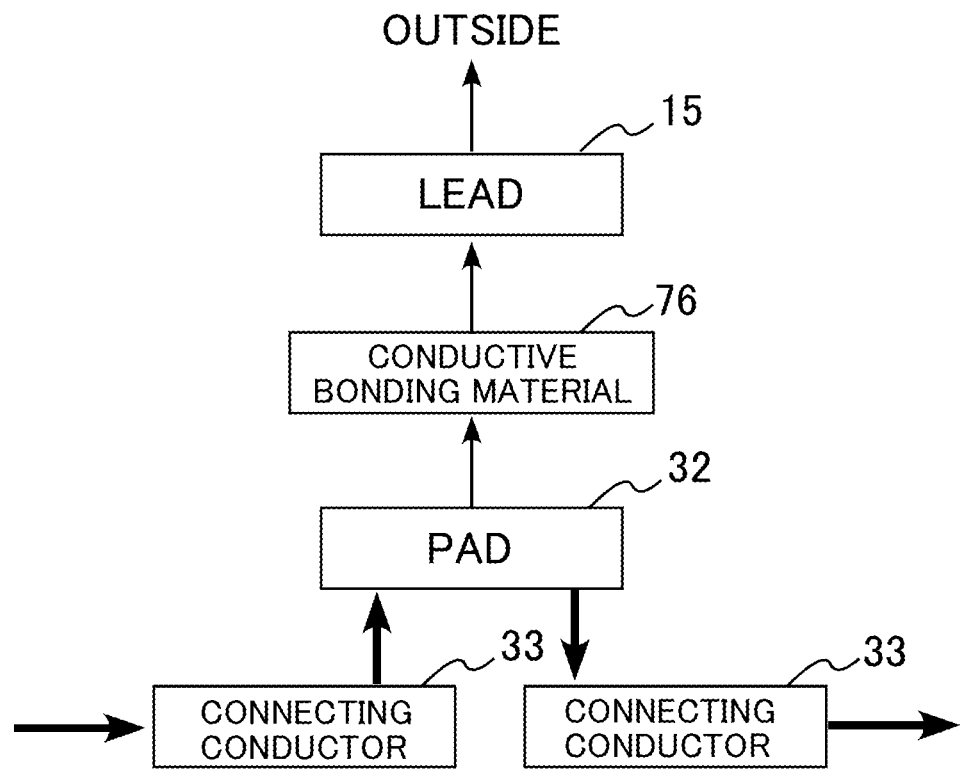
FIG. 12 is a schematic view for explaining the relationship between the connection state of a pad and a lead and noise transmission.
Figure 12:
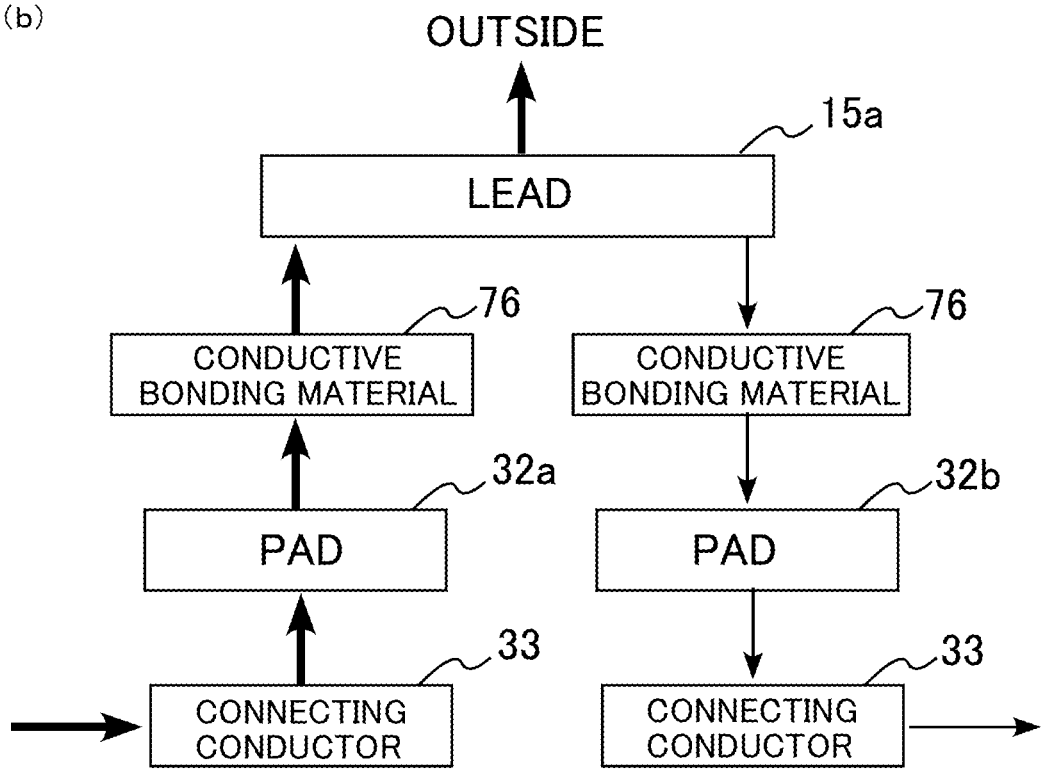

FIG. 12 is a schematic view for explaining the relationship between the connection state of the pad 32 and the lead 15 and noise transmission. The direction of the arrows in this figure indicates the direction of noise transmission, and the thickness of the arrows indicates the magnitude of the noise transmitted.

FIG. 12(a) shows the state in which two connecting conductors 33 are connected to a single pad 32, and the pad 32 is connected to the lead 15 via the conductive bonding material 76. As shown in the figure, the noise input to the pad 32 via one of the connecting conductors 33 is released to the outside via the conductive bonding material 76 and the lead 15. However, since the resistive component of the conductive bonding material 76 hinders this, the noise is also transmitted to the other connecting conductor 33 and input to the electronic component to which that connecting conductor 33 is connected.

FIG. 12(b) shows the state in which each of the pad 32a and the pad 32b, to which connecting conductors 33 are connected, respectively, is connected to the lead 15a via the conductive bonding material 76. As shown in the figure, the noise input to the pad 32a via one of the connecting conductors 33 is released to the outside via the conductive bonding material 76 and the lead 15a. Although a part of the noise is also transmitted to the pad 32b via the conductive bonding material 76, the transmission is hindered by the resistive component of the conductive bonding material 76. Thus, the noise transmission through the pad 32b and the connecting conductor 33 connected to the pad is prevented.

In this way, as compared with the connection state shown in FIG. 12(a), the connection state shown in FIG. 12(b) advantageously reduces the effects of noise by reducing transmission of the noise generated by an electronic component to another electronic component which is electrically connected to the same lead 15 as the noise-generating electronic component.

According to the present embodiment, the bonded part 151 of the lead 15a has a wide portion 151c at the end opposite the projecting part 152. The wide portion 151c is suitable for bonding to the pads 32a and 32b aligned in the x-direction orthogonal to the direction in which the lead 15a extends (y-direction), at an end of the substrate front surface 21 in the y-direction. The bonded part 151 of the lead 15b extends in a strip-like shape. Such a bonded part 151 is suitable for bonding to the pad 32c and the pad 32d surrounded by other pads 32, pads 31 and connecting conductors 33. The same holds true for the lead 15c. The bonded part 151 of the lead 15d extends in a strip-like shape. This bonded part 151 is suitable for bonding to the pad 32g and the pad 32h aligned in the y direction at an end of the substrate front surface 21 in the x direction.

According to the present embodiment, some of the connecting conductors 33 of the conductive part 3 are arranged to overlap with the control units 5 as viewed in the z direction. Thus, as compared with the case where the conduction path is detoured so as not to overlap with the control units 5, the conduction path can be made shorter, and the degree of freedom in designing the conduction path increases. This leads to higher integration of the semiconductor device A1.

According to the present embodiment, since the leads 1 have a higher thermal conductivity than the substrate 2, reduction of the heat dissipation from the semiconductor chip 4 due to the use of the substrate 2 is prevented. Each semiconductor chip 4 is directly bonded to a lead 11 or a lead 12 with the conductive bonding material. Such an arrangement provides the electrical conduction between the semiconductor chip 4 and the lead 11 (12) and also allows the heat from the semiconductor chip 4 to be efficiently transferred to the lead 11 (12). Also, the leads 1 exposed from the sealing resin 8 provide the conduction path from the outside to the semiconductor chips 4 and also promote heat dissipation from the semiconductor chips 4. The substrate 2 is formed with bonding parts 25, and the leads 11-14 are bonded to the substrate 2 via the bonding parts 25. As compared with the surface roughness of the substrate front surface 21 of the substrate 2, which may be made of ceramics, the surfaces of the bonding parts 25 can be made smoother. Thus, undesirable generation of minute voids in the heat transfer path from the leads 11-14 to the substrate 2 is prevented, which further promotes the heat dissipation of the semiconductor chips 4. Moreover, the substrate back surface 22 of the substrate 2 is exposed from the sealing resin 8. Thus, heat conducted from the semiconductor chips 4 to the substrate 2 is efficiently dissipated to the outside.

According to the present embodiment, the conductive part 3 and the bonding parts 25 contain the same conductive material, which means that the conductive part 3 and the bonding parts 25 can be formed on the substrate 2 at once. This is desirable for improving the manufacturing efficiency of the semiconductor device A1. The leads 15 are bonded to the pads 32 of the conductive part 3 via the conductive bonding material 76. With such an arrangement, the leads 15 are strongly bonded to the substrate 2.

In the present embodiment, the case where the substrate 2 is an unstacked substrate has been described, but the substrate 2 may be a multilayer substrate such as a PCB. In such a case, the conductive part 3 can be arranged in multiple layers, which allows more complex wiring and increases the degree of freedom in designing the wiring.

In the present embodiment, a plurality of pads 32 connected to analog power supply terminals or ground terminals of the control devices 5 are bonded to a same lead 15, but the present disclosure is not limited to this. For example, a plurality of pads 32 connected to digital power supply terminals of the control units 5 may be bonded to a same lead 15, or a plurality of pads 32 connected to the terminals for signals of the control units 5 may be bonded to a same lead 15.

Figure 13:
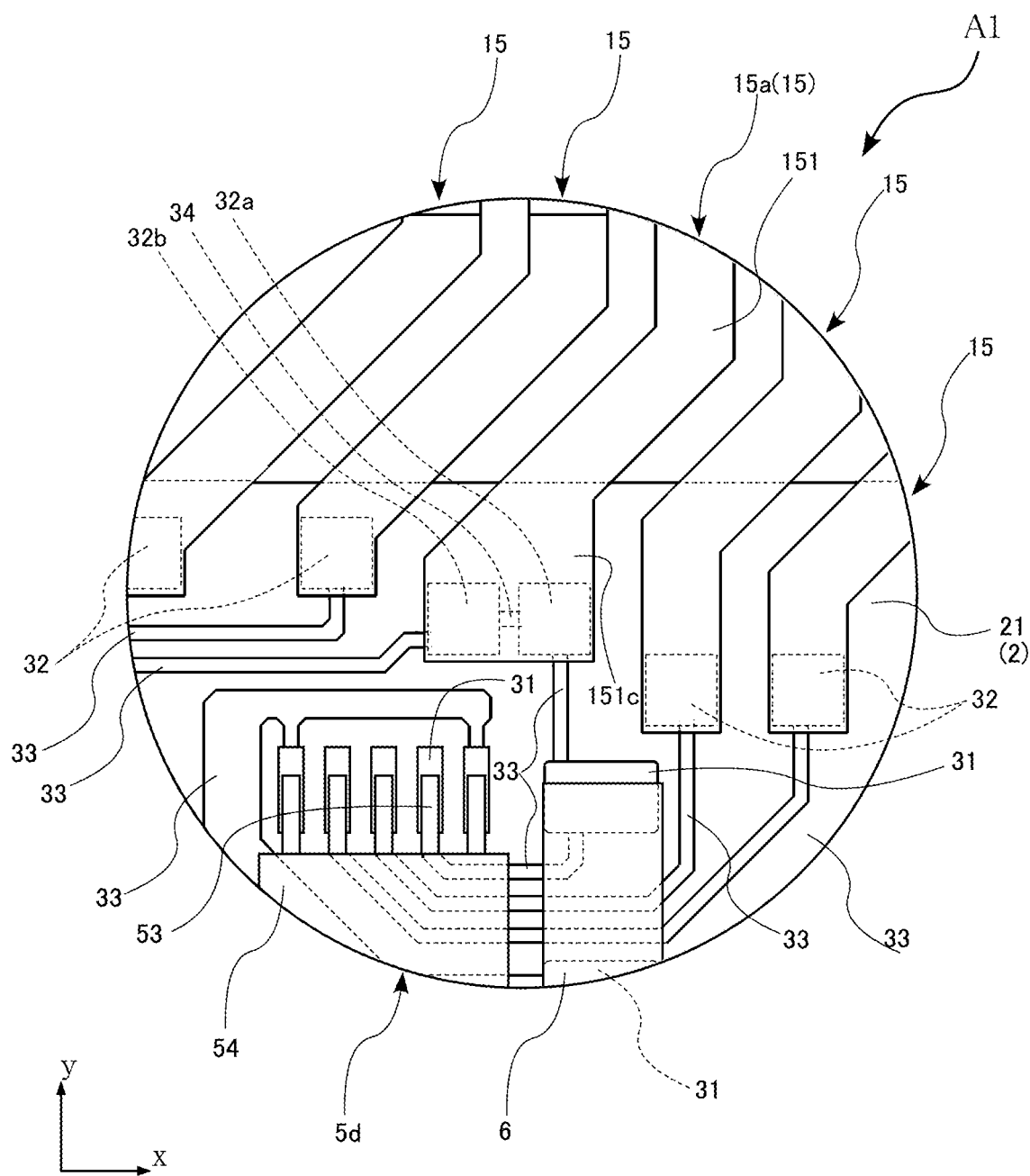
FIG. 13 is an enlarged plan view showing a portion of a variation the semiconductor device of FIG. 1.

In the present embodiment, the case where the pad 32a and the pad 32b are not connected to each other in the conductive part 3 has been described, but the present disclosure is not limited to this. As shown in FIG. 13, the pad 32a and the pad 32b may be connected by a connecting section 34. The connecting section 34 is included in the conductive part 3 and made of an electrically conductive material. The connecting section 34 is disposed between the pad 32a and the pad 32b, with one end in the x direction connected to the pad 32a and the other end connected to the pad 32b. The dimension of the connecting section 34 in the y direction is sufficiently smaller than the dimension of the pad 32a and the pad 32b in the y direction. Thus, the connecting section 34 has an impedance to high-frequency components that is sufficiently high as compared with that of the conduction path between the pad 32a and the pad 32b via the conductive bonding material 76 and the lead 15a. Thus, noise transmission between the pad 32a and the pad 32b via the connecting section 34 is prevented. According to this variation, even when either the pad 32a or the pad 32b fails to be bonded to the lead 15a, a defect of open circuit between the pads and the lead will not occur since the pad 32a and the pad 32b are mutually connected by the connecting section 34, thereby ensuring electrical conduction.

Figure 14:
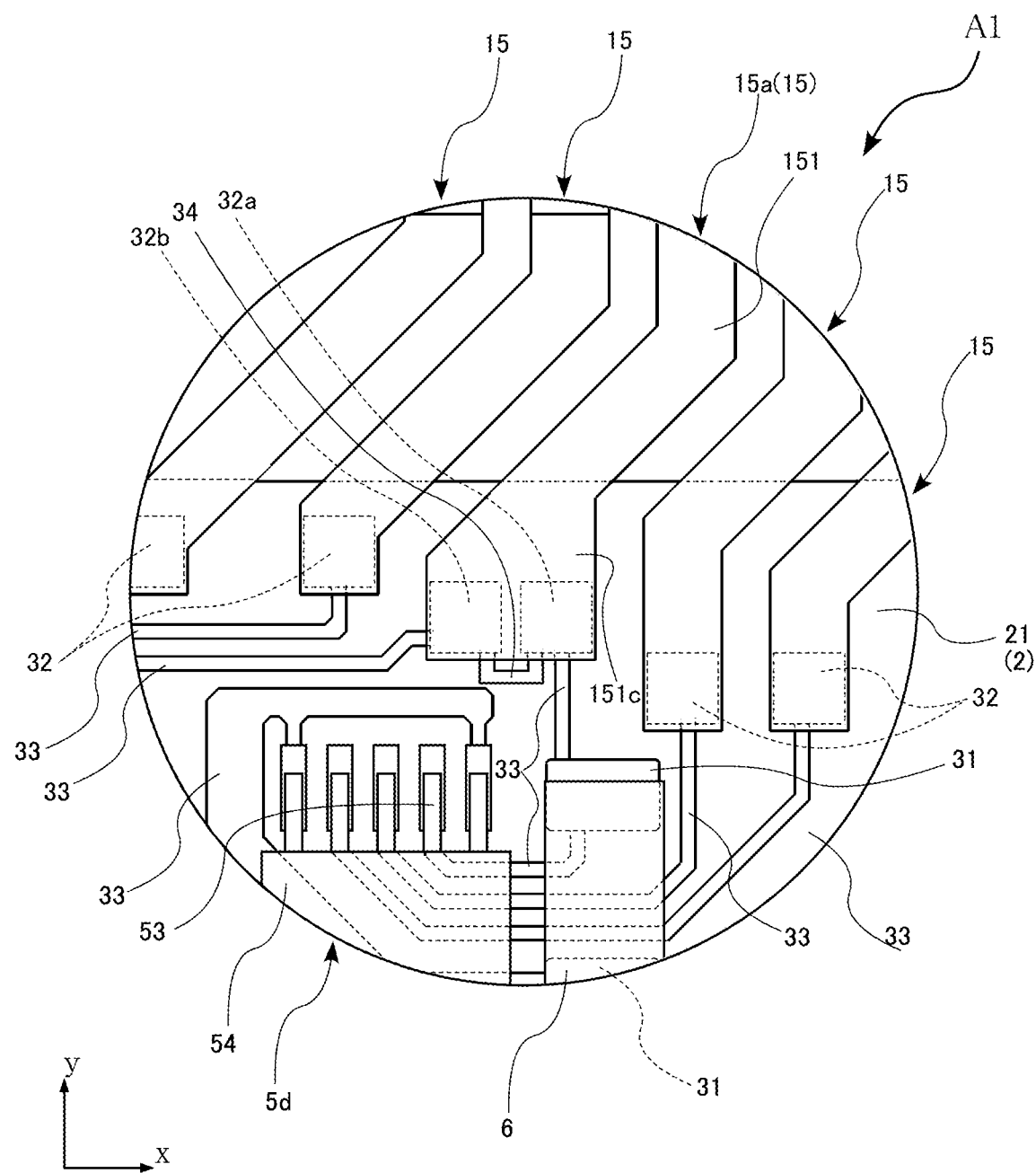
FIG. 14 is an enlarged plan view showing a portion of a variation the semiconductor device of FIG. 1.

The shape of the connecting section 34 is not limited to that shown in FIG. 13. The connecting section 34 may not connect the pad 32a and the pad 32b at the shortest distance but may have a shape to form a detour as shown in FIG. 14. The connecting section 34 according to this variation is U-shaped, opening toward the first side in the y direction (upper side in FIG. 14), and is disposed on the second side in the y direction (lower side in FIG. 14) with respect to the pad 32a and the pad 32b. One end of the connecting section 34 is connected to the pad 32a, and the other end is connected to the pad 32b. The connecting section 34 includes a portion that does not overlap with the lead 15a as viewed in the z direction. This variation improves the impedance to high-frequency components of the connecting section 34. Also, this variation prevents the liquified conductive bonding material 76 from flowing along the connecting section 34 and thereby connecting the pad 32a and the pad 32b during the bonding of the lead 15a. The connecting section 34 may have a more complicated shape (e.g., zigzag shape). When the two pads 32 are spaced apart by a sufficient distance, like the pad 32c and the pad 32d (see FIG. 7), the pad 32e and the pad 32f (see FIG. 8), and the pad 32g and the pad 32h (see FIG. 9), the connecting section 34 does not need to detour or have a complicated shape.

FIGS. 15-18 show other embodiment of the present disclosure. In these figures, the elements that are identical or similar to those of the foregoing embodiments are denoted by the same reference signs as those used for the foregoing embodiments.

Second Embodiment

Figure 15:
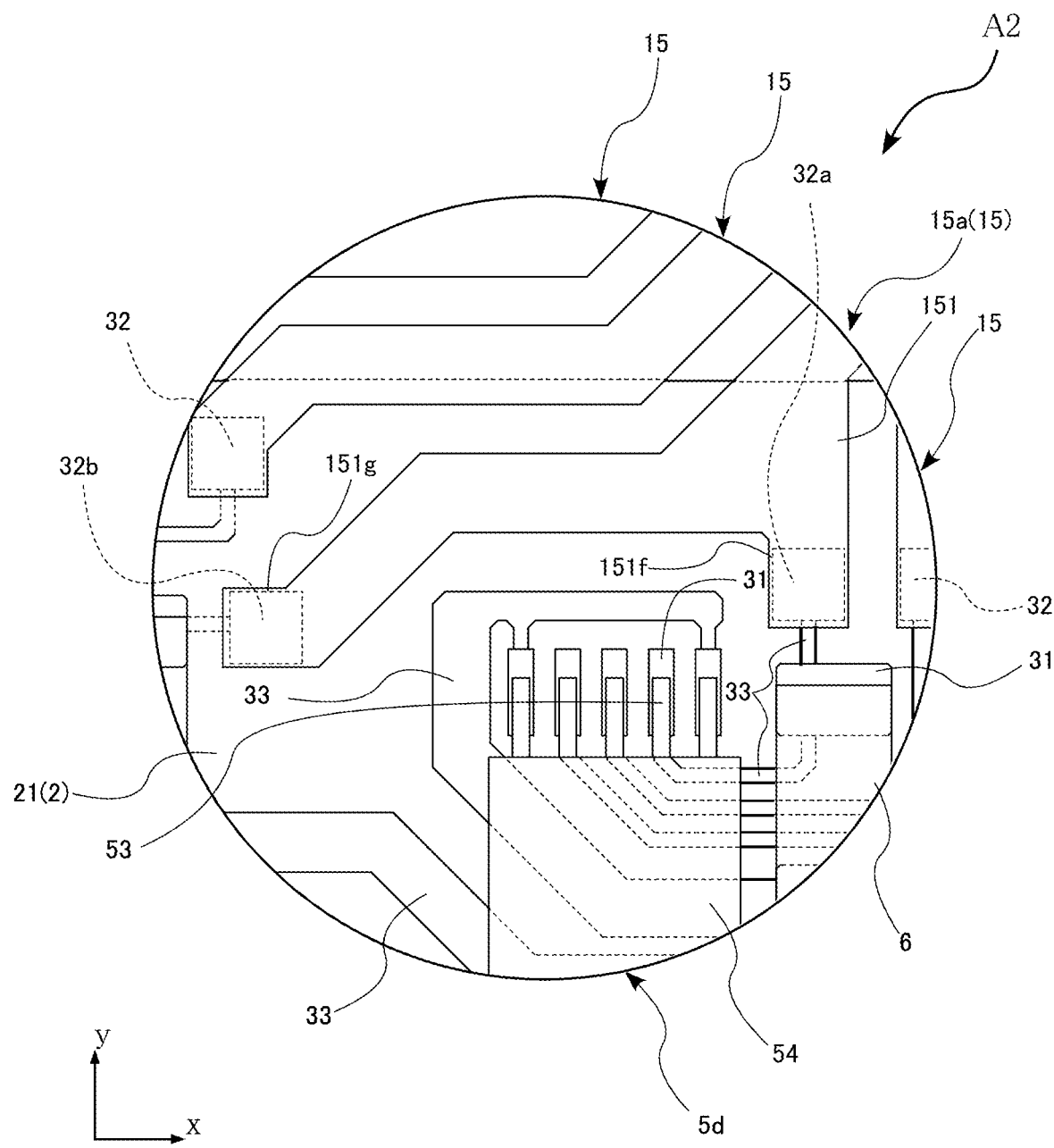
FIG. 15 is an enlarged plan view showing a portion of a semiconductor device according to a second embodiment of the present disclosure.

FIG. 15 is a view for explaining a semiconductor device A2 according to a second embodiment of the present disclosure. FIG. 15 is an enlarged plan view showing a portion of the semiconductor device A2 and may correspond to FIGS. 6-9. In FIG. 15, the sealing resin 8 is omitted. The semiconductor device A2 of the present embodiment differs from the first embodiment in arrangement position of the pad 32b and shape of the lead 15a.

In the semiconductor device A2 according to the present embodiment, the pad 32b is disposed at a position spaced apart from the pad 32a in the x direction and on the opposite side of the pad 32a with respect to the control unit 5d in the x direction. The bonded part 151 of the lead 15a has, instead of the wide portion 151c, a first branched end 151f and a second branched end 151g on the opposite side of the projecting part 152. The pad 32a is bonded to the first branched end 151f, and the pad 32b is bonded to the second branched end 151g.

In the present embodiment again, the substrate front surface 21 of the substrate 2 is formed with the conductive part 3, and the control units 5 are conductively bonded to the pads 31 of the conductive part 3. With such an arrangement, the conduction paths to the control units 5 can be constituted by the conductive part 3 formed on the substrate front surface 21, so that it is possible to provide thinner and denser conduction paths. The lead 15a is bonded to each of the pad 32a and the pad 32b via the conductive bonding material 76. This prevents noise transmission between the pad 32a and the pad 32b via the conductive bonding material 76 and the lead 15a.

According to the present embodiment, the bonded part 151 of the lead 15a has a first branched end 151f and a second branched end 151g on the opposite side of the projecting part 152. The pad 32a is bonded to the first branched end 151f, and the pad 32b is bonded to the second branched end 151g. The bonded part 151 is suitable for bonding to the pad 32a and the pad 32b spaced apart from each other.

Third Embodiment

Figure 16:
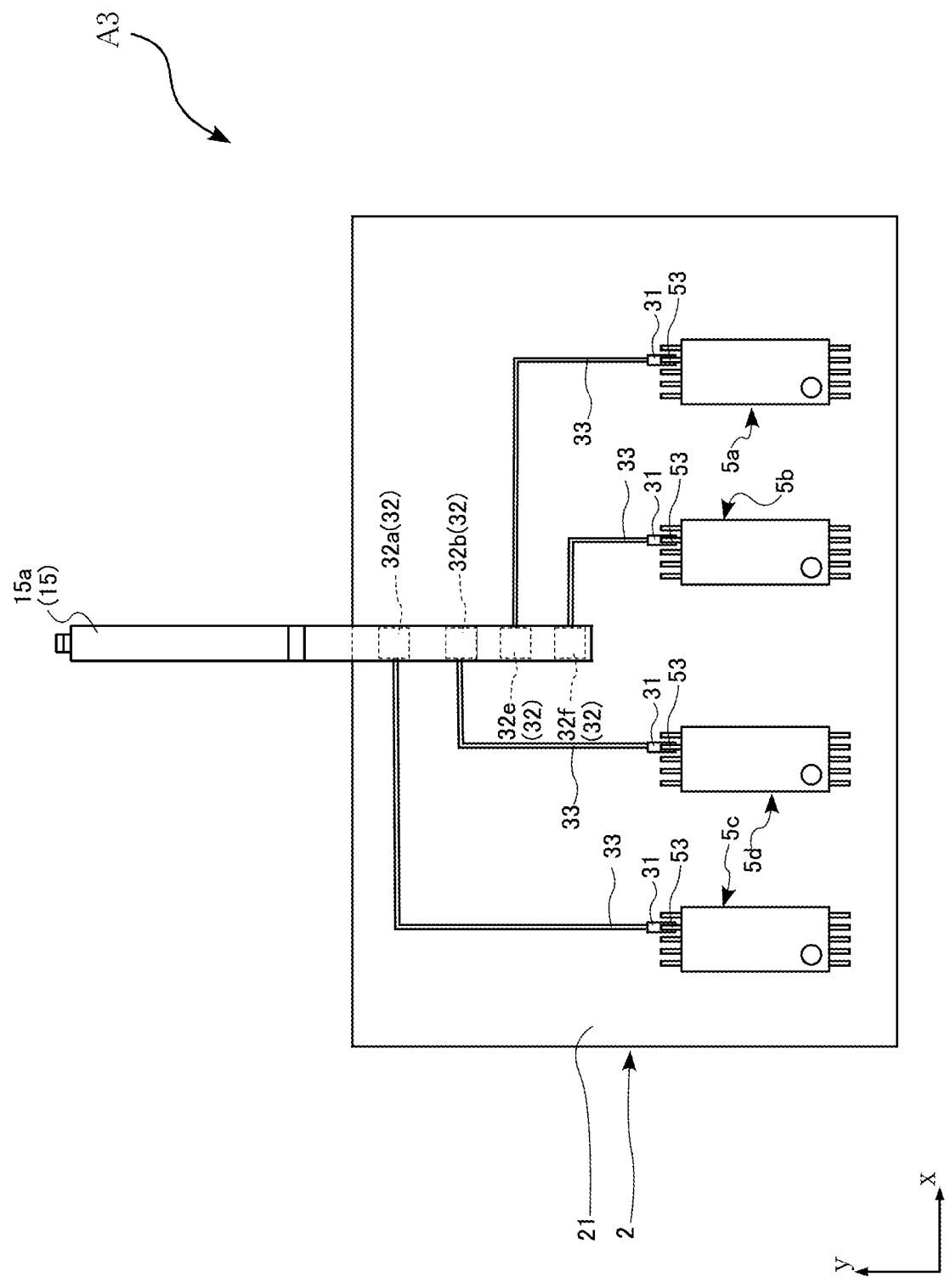
FIG. 16 is a simplified plan view showing a semiconductor device according to a third embodiment of the present disclosure.

FIG. 16 is a view for explaining a semiconductor device A3 according to a third embodiment of the present disclosure. FIG. 16 is a simplified plan view showing the semiconductor device A3. In FIG. 16, only the elements necessary for describing the semiconductor device A3 are shown, and other elements are omitted. The shape and arrangement of the elements are simplified in the figure. The semiconductor device A3 of the present embodiment differs from the first embodiment in that the lead 15 is bonded to four pads 32.

In the semiconductor device A1 according to the first embodiment, the lead 15a is bonded to the pad 32a electrically connected to the control unit 5d and the pad 32b electrically connected to the control unit 5c, and the lead 15c is bonded to the pad 32e electrically connected to the control unit 5a and the pad 32f electrically connected to the control unit 5b. That is, four control units 5 are connected to two leads 15, two to each lead. In contrast, in the semiconductor device A3 according to the third embodiment, the lead 15a is connected to four pads 32, i.e., the pads 32a, 32b, 32e and 32f. That is, the four control units 5 are connected to a single lead 15a. In the present embodiment, the pad 32c or the pad 32d is an example of "third pad". The arrangement position of the pads 32a, 32b, 32e and 32f and the shape of the connecting conductors 33 connected to the pads 32a, 32b, 32e, 32f are not limited and may be designed appropriately, considering the arrangement and shape of other pads 32, 31 and connecting conductors 33. The shape of the lead 15a is not limited and may be designed according to the arrangement of the pads 32a, 32b, 32e and 32f. The substrate 2 may be a multilayer substrate, and some of the connecting conductors 33 may be disposed on a layer other than the substrate front surface 21.

In the present embodiment again, the substrate front surface 21 of the substrate 2 is formed with the conductive part 3, and the control units 5 are conductively bonded to the pads 31 of the conductive part 3. With such an arrangement, the conduction paths to the control units 5 can be constituted by the conductive part 3 formed on the substrate front surface 21, so that it is possible to provide thinner and denser conduction paths. The lead 15a is bonded to four pads 32a, 32b, 32e and 32f via the conductive bonding material 76. This prevents noise transmission between the pads 32a, 32b, 32e and 32f via the conductive bonding material 76 and the leads 15.

The case where a single lead 15 is connected to two pads 32 has been described in the first embodiment, and the case where a single lead 15 is connected to four pads 32 has been described in the third embodiment, but the present disclosure is not limited to these. A single lead 15 may be bonded to three pads 32 or may be bonded to five or more pads 32.

Fourth Embodiment

Figure 17:
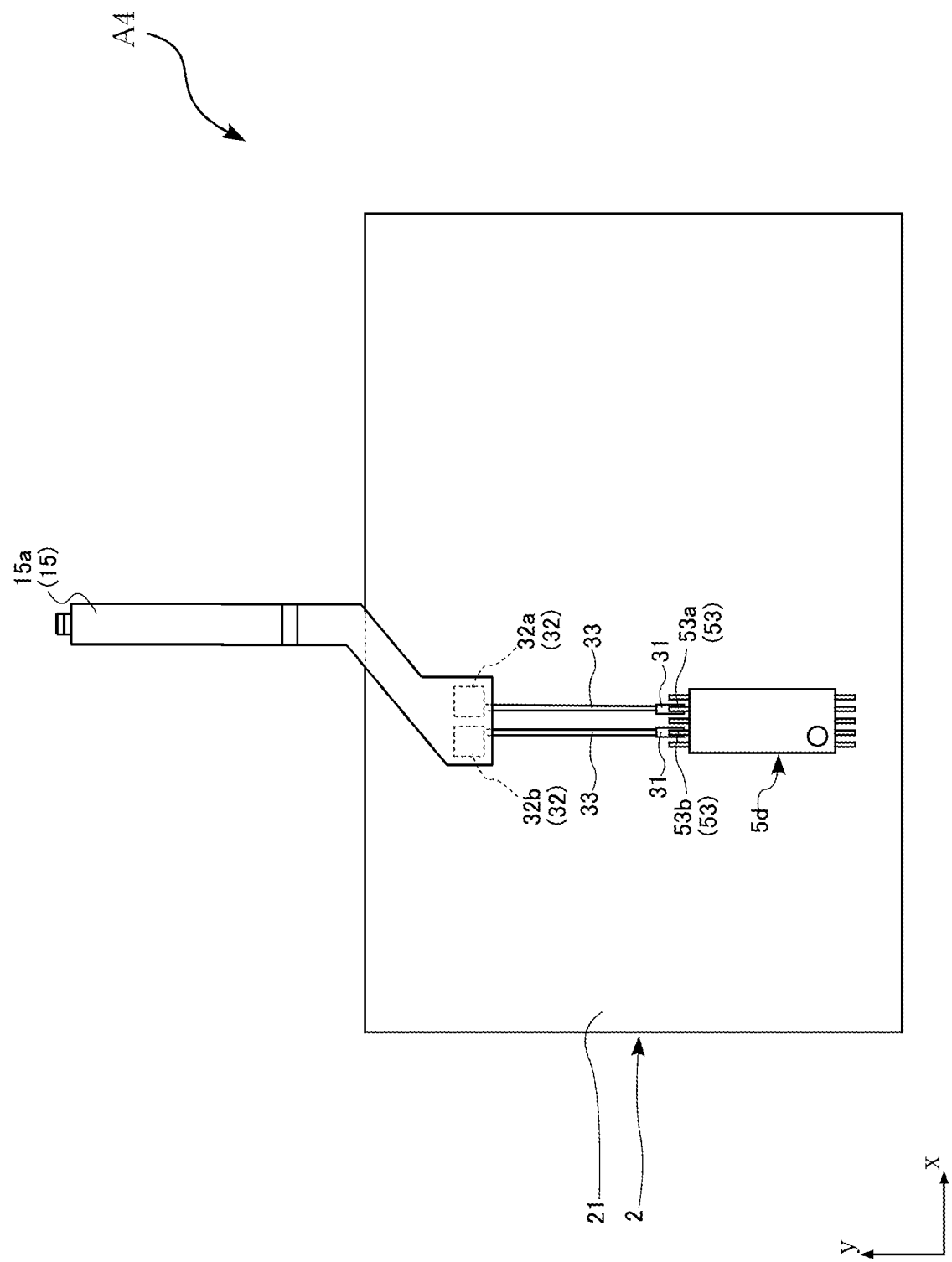
FIG. 17 is a simplified plan view showing a semiconductor device according to a fourth embodiment of the present disclosure.

FIG. 17 is a view for explaining a semiconductor device A4 according to a fourth embodiment of the present disclosure. FIG. 17 is a simplified plan view showing the semiconductor device A4. In FIG. 17, only the elements necessary for describing the semiconductor device A4 are shown, and other elements are omitted. The shape and arrangement of the elements are simplified in the figure. The semiconductor device A4 of the present embodiment differs from the first embodiment in that the lead 15 is bonded to two pads 32 electrically connected to different leads 53 of the same control unit 5.

In the semiconductor device A1 according to the first embodiment, the lead 15a is bonded to the pad 32a electrically connected to the control unit 5d and the pad 32b electrically connected to the control unit 5c. That is, the lead 15a is connected to two control units 5. In contrast, in the semiconductor device A4 according to the fourth embodiment, the lead 15a is bonded to the pad 32a and the pad 32b that are electrically connected to different leads 53 of the control unit 5d. That is, the lead 15a is connected to different leads 53 of the same control unit 5. The pad 32a is electrically connected to the lead 53a, which is the analog power supply terminal of the control unit 5d, via a connecting conductor 33 and a pad 31. The pad 32b is electrically connected to the lead 53b, which is the digital power supply terminal of the control unit 5d, via a connecting conductor 33 and a pad 31. That is, the lead 15a is electrically connected to the analog power supply terminal and the digital power supply terminal of the control unit 5d. The arrangement position of the pads 32a and 32b and the shape of the connecting conductors 33 connected to the pads 32a and 32b are not limited and may be designed as appropriate with the arrangement and shape of other pads 32, 31 and connecting conductors 33. The shape of the lead 15a is not limited and may be designed according to the arrangement of the pads 32a and 32b. The substrate 2 may be a multilayer substrate, and some of the connecting conductors 33 may be disposed on a layer other than the substrate front surface 21.

In the present embodiment again, the substrate front surface 21 of the substrate 2 is formed with the conductive part 3, and the control units 5 are conductively bonded to the pads 31 of the conductive part 3. With such an arrangement, the conduction paths to the control units 5 can be constituted by the conductive part 3 formed on the substrate front surface 21, so that it is possible to provide thinner and denser conduction paths. The lead 15a is bonded to each of the pad 32a and the pad 32b via the conductive bonding material 76. This prevents noise transmission between the pad 32a and the pad 32b via the conductive bonding material 76 and the lead 15a.

The present embodiment has described the case where the pad 32a is electrically connected to the lead 53a that is the analog power supply terminal while the pad 32b is electrically connected to the lead 53b that is the digital power supply terminal, but the present disclosure is not limited to this. The pads 32a and 32b may be electrically connected to the leads 53 that are other terminals. For example, the pad 32a may be electrically connected to the lead 53 that is the analog ground terminal, and the pad 32b may be electrically connected to the lead 53 that is the digital ground terminal.

Fifth Embodiment

Figure 18:
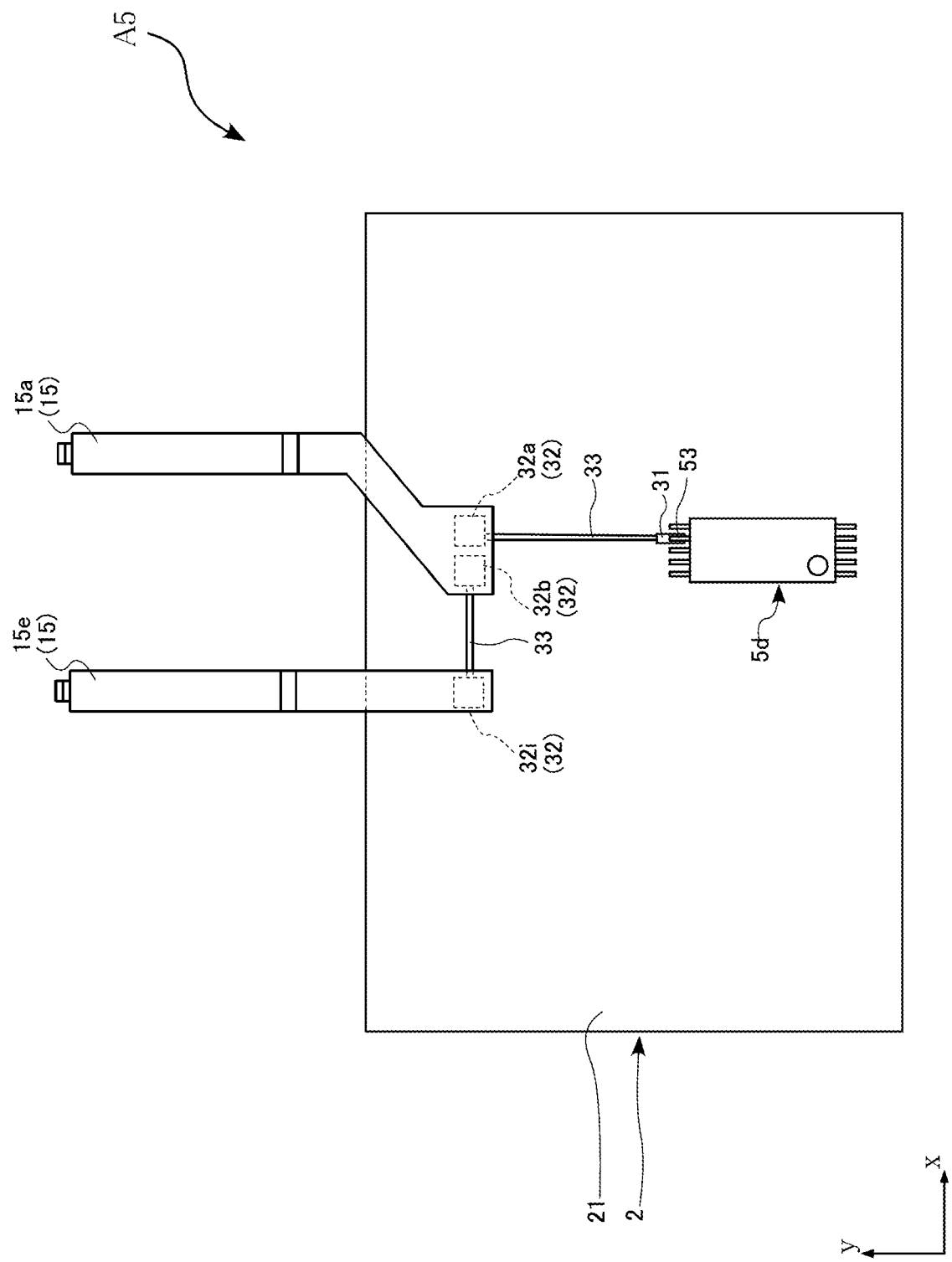
FIG. 18 is a plan view showing a semiconductor device according to a fifth embodiment of the present disclosure.

FIG. 18 is a view for explaining a semiconductor device A5 according to a fifth embodiment of the present disclosure. FIG. 18 is a simplified plan view showing the semiconductor device A5. In FIG. 18, only the elements necessary for describing the semiconductor device A5 are shown, and other elements are omitted. The shape and arrangement of the elements are simplified in the figure. The semiconductor device A5 of the present embodiment differs from the first embodiment in that one of the two pads 32 to which a lead 15 is bonded is electrically connected to another lead 15.

In the semiconductor device A1 according to the first embodiment, the lead 15a is bonded to the pad 32a electrically connected to the control unit 5d and the pad 32b electrically connected to the control unit 5c. That is, the lead 15a is connected to two control units 5. In contrast, in the semiconductor device A5 according to the fifth embodiment, the pad 32b is electrically connected to the lead 15e, not to a control unit 5. That is, the lead 15a is connected to the control unit 5d and the lead 15e. The pad 32a is electrically connected to the lead 53a, which is the analog power supply terminal of the control unit 5d, via a connecting conductor 33 and a pad 31. The pad 32b is electrically connected to the lead 15e via a connecting conductor 33 and a pad 32i. The pad 32i is one of the plurality of pads 32 and disposed adjacent to the pad 32b. The lead 15e is one of the plurality of leads 15 and bonded to the pad 32i via the conductive bonding material 76. That is, the lead 15a is electrically connected to the control unit 5d and the lead 15e. In the present embodiment, the lead 15e is an example of "second lead", and the pad 32b is an example of "first pad". The lead 15e is connected to a capacitor, for example, outside the semiconductor device A5. The control unit 5d of the semiconductor device A5 does not have the function of detecting the voltage of an analog power supply, so that the voltage of the analog power supply input from the lead 15a cannot be detected inside the semiconductor device A5. However, the voltage of the analog power supply can be detected outside the semiconductor device A5 by detecting the voltage between the terminals of the capacitor connected to the lead 15e electrically connected to the lead 15a.

In the present embodiment again, the substrate front surface 21 of the substrate 2 is formed with the conductive part 3, and the control units 5 are conductively bonded to the pads 31 of the conductive part 3. With such an arrangement, the conduction paths to the control units 5 can be constituted by the conductive part 3 formed on the substrate front surface 21, so that it is possible to provide thinner and denser conduction paths. The lead 15a is bonded to each of the pad 32a and the pad 32b via the conductive bonding material 76. This prevents noise transmission between the pad 32a and the pad 32b via the conductive bonding material 76 and the lead 15a.

The present embodiment has described the case where the pad 32a is electrically connected to the control unit 5d, and the pad 32b is electrically connected to the pad 32i bonded to the lead 15e, but the present disclosure is not limited to this. One of the pads 32 to which the lead 15 is bonded may be electrically connected to only a passive element 6 via a connecting conductor 33 and a pad 31 or may be electrically connected, via a connecting conductor 33, to a pad 31 to which an end of a wire is bonded.

The semiconductor device according to the present disclosure is not limited to the foregoing embodiments. The specific configuration of each part of the semiconductor device according to the present disclosure may be varied in many ways.

Clause 1.
A semiconductor device comprising:
a substrate having a substrate front surface and a substrate back surface facing away from each other in a thickness direction;
a conductive part formed on the substrate front surface;
a semiconductor chip disposed on the substrate front surface;
a control unit that is disposed on the substrate front surface and controls the semiconductor chip;
a sealing resin that covers the semiconductor chip, the control unit, the conductive part and at least a portion of the substrate;
a conductive bonding material; and
a first lead bonded to the conductive part via the conductive bonding material and partially exposed from the sealing resin, wherein
the conductive part includes a first pad and a second pad disposed apart from each other, and
the first lead is bonded to the first pad and the second pad.

Clause 2.
The semiconductor device according to clause 1, wherein the conductive part further includes a connecting section connected to the first pad and the second pad, and
the connecting section includes a portion that is smaller than the first pad and the second pad in dimension in a direction orthogonal to the thickness direction.

Clause 3.
The semiconductor device according to clause 2, wherein the connecting section has an impedance higher than that of a conduction path between the first pad and the second pad via the conductive bonding material and the first lead.

Clause 4.
The semiconductor device according to clause 2 or 3, wherein the connecting section includes a portion that does not overlap with the first lead as viewed in the thickness direction.

Clause 5.
The semiconductor device according to one of clauses 1-4, wherein the first lead has a strip-like shape and has a projecting part extending out of the sealing resin and a bonded part bonded to the conductive part,
the bonded part has a wide portion at an end opposite the projecting part, and
the first pad and the second pad are bonded to the wide portion.

Clause 6.
The semiconductor device according to one of clauses 1-4, wherein the first lead has a strip-like shape and has a projecting part extending out of the sealing resin and a bonded part bonded to the conductive part,
the bonded part has a first end closer to the projecting part and a second end farther from the projecting part, and
the first pad and the second pad are arranged along a direction in which the first end and the second end are spaced apart from each other.

Clause 7.
The semiconductor device according to one of clauses 1-4, wherein the first lead has a strip-like shape and has a projecting part extending out of the sealing resin and a bonded part bonded to the conductive part,
the bonded part has a first branched end and a second branched end on an opposite side of the projecting part,
the first pad is bonded to the first branched end, and
the second pad is bonded to the second branched end.

Clause 8.
The semiconductor device according to one of clauses 1-7, wherein the first pad and the second pad are electrically connected to the control unit.

Clause 9.
The semiconductor device according to clause 8, wherein the first pad is electrically connected to an analog power supply terminal of the control unit, and
the second pad is electrically connected to a digital power supply terminal of the control unit.

Clause 10.
The semiconductor device according to one of clauses 1-7, further comprising a second lead bonded to the conductive part and partially exposed from the sealing resin, wherein the first pad is electrically connected to the second lead.

Clause 11.
The semiconductor device according to one of clauses 1-7, further comprising:
a second semiconductor chip disposed on the substrate front surface; and
a second control unit that is disposed on the substrate front surface and controls the second semiconductor chip, wherein
the first pad is electrically connected to said control unit, and
the second pad is electrically connected to the second control unit.

Clause 12.
The semiconductor device according to one of clauses 1-11, wherein the conductive part further includes a third pad, and
the first lead is bonded to the third pad.

Clause 13.
The semiconductor device according to one of clauses 1-12, further comprising a third lead disposed on the substrate front surface, having a thermal conductivity higher than that of the substrate, and partially exposed from the sealing resin,
wherein the semiconductor chip is disposed on the third lead.

Clause 14.
The semiconductor device according to clause 13, further comprising a bonding part formed on the substrate front surface and containing a conductive material that forms the conductive part,
wherein the third lead is bonded to the bonding part.

Clause 15.
The semiconductor device according to one of clauses 1-14, wherein the semiconductor chip is a power transistor that controls electric power.

Clause 16.
The semiconductor device according to one of clauses 1-15, wherein the semiconductor chip further includes a back surface electrode bonded to the first lead.

Clause 17.
The semiconductor device according to one of clauses 1-16, wherein the substrate back surface is exposed from the sealing resin.

Clause 18.
The semiconductor device according to one of clauses 1-17, wherein the substrate is made of ceramics.

LIST OF REFERENCE CHARACTERS

A1, A2, A3, A4, A5: Semiconductor device
1, 11, 11a, 11b, 12, 12a, 12b: Lead
13, 13a, 13b, 14, 15, 15a-15e: Lead
111: Bonded part 111a: Front surface
111b: Back surface 112: Projecting part
113: Inclined connection part 114: Parallel connection part
151: Bonded part 151a: Front surface
151b: Back surface 151c: Wide portion
151d: First end 151e: Second end
151f: First branched end 151g: Second branched end
152: Projecting part 153: Inclined connection part
154: Parallel connection part 2: Substrate
21: Substrate front surface 22: Substrate back surface
25, 251-254: Bonding part 3: Conductive part
31: Pad 32, 32a-32i: Pad
33: Connecting conductor 34: Connecting section
4, 4a, 4b, 4c, 4d: Semiconductor chip
41: Element front surface 42: Element back surface
43: Source electrode 44: Gate electrode
45: Drain electrode 5, 5a, 5b, 5c, 5d: Control unit
53, 53a, 53b: Lead
6: Passive elements 6a: Shunt resistor
71, 72: Wire 75: Bonding material
76: Conductive bonding material 8: Sealing resin
81: Resin front surface 82: Resin back surface
83: Resin side surface

The invention claimed is:
1. A semiconductor device comprising:
a substrate having a substrate front surface and a substrate back surface facing away from each other in a thickness direction;
a conductive part made of an electrically conductive material and formed on the substrate front surface;
a semiconductor chip disposed on the substrate front surface;
a control unit that is disposed on the substrate front surface and controls the semiconductor chip;
a sealing resin that covers the semiconductor chip, the control unit, the conductive part and at least a portion of the substrate;
a conductive bonding material; and
a first lead bonded to the conductive part via the conductive bonding material and partially exposed from the sealing resin, wherein
the conductive part includes a first pad and a second pad disposed apart from each other, and
the first lead is bonded to the first pad and the second pad.

2. The semiconductor device according to claim 1, wherein the conductive part further includes a connecting section connected to the first pad and the second pad, and
the connecting section includes a portion that is smaller than the first pad and the second pad in dimension in a direction orthogonal to the thickness direction.

3. The semiconductor device according to claim 2, wherein the connecting section has an impedance higher than that of a conduction path between the first pad and the second pad via the conductive bonding material and the first lead.

4. The semiconductor device according to claim 2, wherein the connecting section includes a portion that does not overlap with the first lead as viewed in the thickness direction.

5. The semiconductor device according to claim 1, wherein the first lead has a strip-like shape and has a projecting part extending out of the sealing resin and a bonded part bonded to the conductive part,
the bonded part has a wide portion at an end opposite the projecting part, and
the first pad and the second pad are bonded to the wide portion.

6. The semiconductor device according to claim 1, wherein the first lead has a strip-like shape and has a projecting part extending out of the sealing resin and a bonded part bonded to the conductive part,
the bonded part has a first end closer to the projecting part and a second end farther from the projecting part, and
the first pad and the second pad are arranged along a direction in which the first end and the second end are spaced apart from each other.

7. The semiconductor device according to claim 1, wherein the first lead has a strip-like shape and has a projecting part extending out of the sealing resin and a bonded part bonded to the conductive part, the bonded part has a first branched end and a second branched end on an opposite side of the projecting part, the first pad is bonded to the first branched end, and the second pad is bonded to the second branched end.

8. The semiconductor device according to claim 1, wherein the first pad and the second pad are electrically connected to the control unit.

9. The semiconductor device according to claim 8, wherein the first pad is electrically connected to an analog power supply terminal of the control unit, and the second pad is electrically connected to a digital power supply terminal of the control unit.

10. The semiconductor device according to claim 1, further comprising a second lead bonded to the conductive part and partially exposed from the sealing resin, wherein the first pad is electrically connected to the second lead.

11. The semiconductor device according to claim 1, further comprising:

a second semiconductor chip disposed on the substrate front surface; and a second control unit that is disposed on the substrate front surface and controls the second semiconductor chip, wherein the first pad is electrically connected to said control unit, and the second pad is electrically connected to the second control unit.

12. The semiconductor device according to claim 1, wherein the conductive part further includes a third pad, and the first lead is bonded to the third pad.

13. The semiconductor device according to claim 1, further comprising a third lead disposed on the substrate front surface, having a thermal conductivity higher than that of the substrate, and partially exposed from the sealing resin, wherein the semiconductor chip is disposed on the third lead.

14. The semiconductor device according to claim 13, further comprising a bonding part formed on the substrate front surface and containing a conductive material that forms the conductive part, wherein the third lead is bonded to the bonding part.

15. The semiconductor device according to claim 1, wherein the semiconductor chip is a power transistor that controls electric power.

16. The semiconductor device according to claim 1, wherein the semiconductor chip further includes a back surface electrode bonded to the third lead.

17. The semiconductor device according to claim 1, wherein the substrate back surface is exposed from the sealing resin.

18. The semiconductor device according to claim 1, wherein the substrate is made of ceramics.

* * * * *